US010826194B2

(12) United States Patent
Gu et al.

(10) Patent No.: US 10,826,194 B2
(45) Date of Patent: Nov. 3, 2020

(54) SCALABLE PHASED ARRAY PACKAGE

(71) Applicant: International Business Machines Corporation, Armonk, NY (US)

(72) Inventors: Xiaoxiong Gu, White Plains, NY (US); Wooram Lee, Briarcliff Manor, NY (US); Duixian Liu, Scarsdale, NY (US); Christian Wilhelmus Baks, Pleasant Valley, NY (US); Alberto Valdes-Garcia, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 141 days.

(21) Appl. No.: 15/901,400

(22) Filed: Feb. 21, 2018

(65) Prior Publication Data

US 2019/0260138 A1 Aug. 22, 2019

(51) Int. Cl.
*H01Q 23/00* (2006.01)
*H01Q 21/06* (2006.01)
(Continued)

(52) U.S. Cl.
CPC ......... *H01Q 21/061* (2013.01); *H01L 21/563* (2013.01); *H01L 23/3675* (2013.01);
(Continued)

(58) Field of Classification Search
CPC .... H01Q 21/061; H01Q 1/2283; H01Q 23/00; H01L 21/563; H01L 23/3675;
(Continued)

(56) References Cited

U.S. PATENT DOCUMENTS 5,025,225 A * 6/1991 Tajima .................. H03F 1/0288
330/124 D
7,477,197 B2 1/2009 Zeng et al.
(Continued)

FOREIGN PATENT DOCUMENTS

CN 103247590 A 8/2013
CN 104701304 A 6/2015

OTHER PUBLICATIONS

International Search Report and Written Opinion received for PCT Application Serial No. PCT/IB2019/051282 dated Jun. 26, 2019, 9 pages.
(Continued)

*Primary Examiner* — Mounir S Amer
*Assistant Examiner* — Alexander Belousov
(74) *Attorney, Agent, or Firm* — Amin, Turocy & Watson, LLP

(57) ABSTRACT

Techniques regarding a scalable phased array are provided. For example, various embodiments described herein can comprise a plurality of integrated circuits having respective flip chip pads, and an antenna-in-package substrate having a ball grid array terminal and a plurality of transmission lines. The plurality of transmission lines can be embedded within the antenna-in-package substrate and can operatively couple the respective flip chip pads to the ball grid array terminal. In one or more embodiments, a die can comprise the plurality of integrated circuits. Further, in one or more embodiments a combiner can also be embedded in the antenna-in-package substrate. The combiner can join the plurality of transmission lines.

14 Claims, 22 Drawing Sheets

(51) Int. Cl.
*H01L 23/66* (2006.01)
*H01L 23/00* (2006.01)
*H05K 1/18* (2006.01)
*H01L 21/56* (2006.01)
*H01Q 1/22* (2006.01)
*H01L 23/367* (2006.01)
*H01L 23/13* (2006.01)

(52) U.S. Cl.
CPC .............. *H01L 23/66* (2013.01); *H01L 24/16* (2013.01); *H01L 24/81* (2013.01); *H01Q 1/2283* (2013.01); *H01Q 23/00* (2013.01); *H05K 1/181* (2013.01); *H01L 23/13* (2013.01); *H01L 24/73* (2013.01); *H01L 24/92* (2013.01); *H01L 2223/6616* (2013.01); *H01L 2223/6633* (2013.01); *H01L 2223/6677* (2013.01); *H01L 2224/16225* (2013.01); *H01L 2224/16227* (2013.01); *H01L 2224/73253* (2013.01); *H01L 2224/81815* (2013.01); *H01L 2224/92125* (2013.01); *H01L 2924/00014* (2013.01); *H01L 2924/1421* (2013.01); *H01L 2924/15321* (2013.01); *H05K 2201/1053* (2013.01); *H05K 2201/10098* (2013.01); *H05K 2201/10515* (2013.01); *H05K 2201/10734* (2013.01)

(58) Field of Classification Search
CPC ......... H01L 23/66; H01L 24/16; H01L 24/81; H01L 23/13; H01L 24/73; H01L 24/92
See application file for complete search history.

(56) References Cited

U.S. PATENT DOCUMENTS

| | | | |
|---|---|---|---|
| 9,203,159 B2 | 12/2015 | Friedman et al. | |
| 9,537,224 B2 | 1/2017 | Friedman et al. | |
| 9,621,115 B1 | 4/2017 | Wu | |
| 2008/0217774 A1 | 9/2008 | Nikaido | |
| 2008/0291115 A1* | 11/2008 | Doan | H01Q 21/0087 343/893 |
| 2009/0209217 A1* | 8/2009 | Coersmeier | H04B 1/3805 455/142 |
| 2012/0001181 A1 | 1/2012 | Aoki et al. | |
| 2012/0063094 A1* | 3/2012 | Gaynes | H05K 3/30 361/707 |
| 2013/0069831 A1 | 3/2013 | Friedman et al. | |
| 2013/0118008 A1 | 5/2013 | Gaynes et al. | |
| 2014/0145883 A1 | 5/2014 | Baks et al. | |
| 2014/0293529 A1 | 10/2014 | Nair et al. | |
| 2015/0325925 A1 | 11/2015 | Kamgaing et al. | |
| 2016/0049723 A1* | 2/2016 | Baks | H01Q 1/2291 343/848 |
| 2016/0178745 A1 | 6/2016 | Mohamadi | |
| 2016/0352023 A1 | 12/2016 | Dang et al. | |
| 2017/0125895 A1* | 5/2017 | Baks | H01L 23/49827 |
| 2018/0331671 A1* | 11/2018 | Jian | H03H 7/463 |
| 2019/0041896 A1* | 2/2019 | Wong | G06F 1/10 |

OTHER PUBLICATIONS

Zihir, et al., 60-GHz 64- and 256-Elements Wafer-Scale Phased-Array Transmitters Using Full-Reticle and Sub-reticle Stitching Techniques, IEEE Transactions on Microwave Theory and Techniques, 2016, 19 Pages, vol. 64, No. 12.

Townley, et al., A 94GHz 4TX-4RX phased-array for FMCW radar with integrated LO and flip-chip antenna package, IEEE Radio Frequency Integrated Circuits Symposium (RFIC), 2016, pp. 294-229.

List of IBM Patents or Applications Treated as Related.

Final Office Action received for U.S. Appl. No. 15/901,371 dated Apr. 16, 2020, 15 pages.

Office Action for U.S. Appl. No. 15/901,371 dated Feb. 5, 2020, 23 pages.

* cited by examiner

SCALABLE PHASED ARRAY PACKAGE

BACKGROUND

The subject disclosure relates to a scalable phased array package, and more specifically, to phased array scaling with a multi-integrated circuit chip and/or a transmission line combiner integrated in a package substrate.

A phased array can be an array of radiating elements (e.g., antennas), which can generate a beam (e.g., a beam of radio waves) and/or steer the beam in one or more directions. The phased array can direct a generated beam without moving the radiating elements via one or more phase shifters, which can shift the phase of a signal emitted from the radiating elements so as to provide constructive and/or destructive wave interference. Operational capacity and/or efficiency of a phased array can be enhanced through use of multiple integrated circuits. Conventional techniques for scaling a phased array to support additional antenna elements through multiple integrated circuits can include, for example: daisy chain combining adjacent integrated circuits on a package substrate, and/or stitching discrete building blocks on a package substrate. However, the conventional techniques can result in: undesirably large number of assembly steps; mismatched coefficients of thermal expansion between chips, packages, and a printed circuit board; non-symmetric combining in amplitude and timing of frequencies due to loss and/or delay accumulation; large printed circuit board size due to the use of external components to support the array, and/or in-efficient use of wafers.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, apparatuses, and/or methods that regard a scalable phased array are described.

According to an embodiment, an apparatus is provided. The apparatus can comprise a die comprising a plurality of integrated circuits, which can have respective flip chip pads. Also, the apparatus can comprise an antenna-in-package substrate. Further, the antenna-in-package substrate can comprise a ball grid array terminal and a plurality of transmission lines. The plurality of transmission lines can be embedded in the antenna-in-package substrate. Moreover, the plurality of transmission lines can operatively couple the respective flip chip pads to the ball grid array terminal.

In an optional embodiment, the apparatus can be scalable, for example by comprising a second die, which can comprise a second plurality of integrated circuits having respective second flip chip pads. Further, the plurality of transmission lines can operatively couple the respective second flip chip pads to the ball grid array terminal.

According to another embodiment, a method is provided. The method can comprise embedding a plurality of transmission lines within an antenna-in-package substrate. The method can also comprise attaching a die to the antenna-in-package substrate. The die can comprise a plurality of integrated circuits having respective flip chip pads. Further, the method can comprise coupling the respective flip chip pads to a ball grid array terminal located on the antenna-in-package substrate via the plurality of transmission lines.

In another optional embodiment, the method can comprise attaching a second die to the antenna-in-package substrate. The second die can comprise a second plurality of integrated circuits having respective second flip chip pads. Also, the method can comprise coupling the respective second flip chip pads to the ball grid array terminal located on the antenna-in-package substrate via the plurality of transmission lines.

According to another embodiment, an apparatus is provided. The apparatus can comprise a wafer segment, which can comprise a plurality of phased array integrated circuits having respective flip chip pads. The apparatus can also comprise an antenna-in-package substrate, which can comprise a ball grid array terminal and a plurality of transmission lines. The plurality of transmission lines can be embedded within the antenna-in-package substrate. Also, the plurality of transmission lines can operatively couple the respective flip chip pads to the ball grid array terminal.

In another optional embodiment, the apparatus can be scalable, for example by comprising a second wafer segment, which can comprise a second plurality of phased array integrated circuits having respective second flip chip pads. Also, the plurality of transmission lines can operatively couple the respective second flip chip pads to the ball grid array terminal.

According to another embodiment, another apparatus is provided. The apparatus can comprise a plurality of integrated circuits having respective flip chip pads. The apparatus can also comprise an antenna-in-package substrate, which can comprise a ball grid array terminal, a plurality of transmission lines, and a combiner. The plurality of transmission lines and the combiner can be embedded within the antenna-in-package substrate. Further, the plurality of transmission lines can be joined by the combiner, and the combiner can couple the respective flip chip pads to the ball grid array terminal.

In another optional embodiment of the apparatus, a first transmission line of the plurality of transmission lines can extend from a first flip chip pad of the respective flip chip pads to the combiner. Also, a second transmission line of the plurality of transmission lines can extend from a second flip chip pad of the respective flip chip pads to the combiner. Moreover, a third transmission line of the plurality of transmission lines can extend from the combiner to the ball grid array terminal.

According to another embodiment, another method is provided. The method can comprise embedding a plurality of transmission lines and a combiner within an antenna-in-package substrate. The method can also comprise attaching a plurality of integrated circuits to the antenna-in-package substrate. The plurality of integrated circuits can comprise respective flip chip pads. The method can further comprise coupling the respective flip chip pads to a ball grid array terminal located on the antenna-in-package substrate via the plurality of transmission lines. At least two transmission lines of the plurality of transmission lines can be joined together in the antenna-in-package substrate by the combiner.

In another optional embodiment of the method, a first transmission line of the plurality of transmission lines can extend from a first flip chip pad of the respective flip chip pads to the combiner. Also, a second transmission line of the plurality of transmission lines can extend from a second flip chip pad of the respective flip chip pads to the combiner.

Moreover, a third transmission line of the plurality of transmission lines can extend from the combiner to the ball grid array terminal.

According to another embodiment, another apparatus is provided. The apparatus can comprise a plurality of integrated circuits having respective flip chip pads. The apparatus can also comprise an antenna-in-package substrate, which can comprise a ball grid array terminal, a plurality of transmission lines, and a combiner. The plurality of transmission lines and the combiner can be embedded within the antenna-in-package substrate. Also, the plurality of transmission lines can operatively couple the respective flip chip pads to the ball grid array terminal. Further, at least two transmission lines of the plurality of transmission lines can be joined together via the combiner.

In another optional embodiment of the apparatus, a first transmission line of the plurality of transmission lines can extend from a first flip chip pad of the respective flip chip pads to the combiner. A second transmission line of the plurality of transmission lines can extend from a second flip chip pad of the respective flip chip pads to the combiner. Also, a third transmission line of the plurality of transmission lines can extend from the combiner to a second combiner. Further, the second combiner can be embedded in the antenna-in-package substrate and join the third transmission line with a fourth transmission line of the plurality of transmission lines.

One or more embodiments described herein can improve overall assembly yield of a phased array by simplifying an attachment processes through the use of a single die that can comprise a plurality of integrated circuits. Additionally, various embodiments described herein can increase a number of integrated circuits in a phased array while reducing a number of required interfaces; thereby enabling small antenna modules and/or alleviating the need for a plurality of board-level components. Further, one or more embodiments described herein can regard a phased array that is capable of scaling through repetition of described structural features.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figure 1:
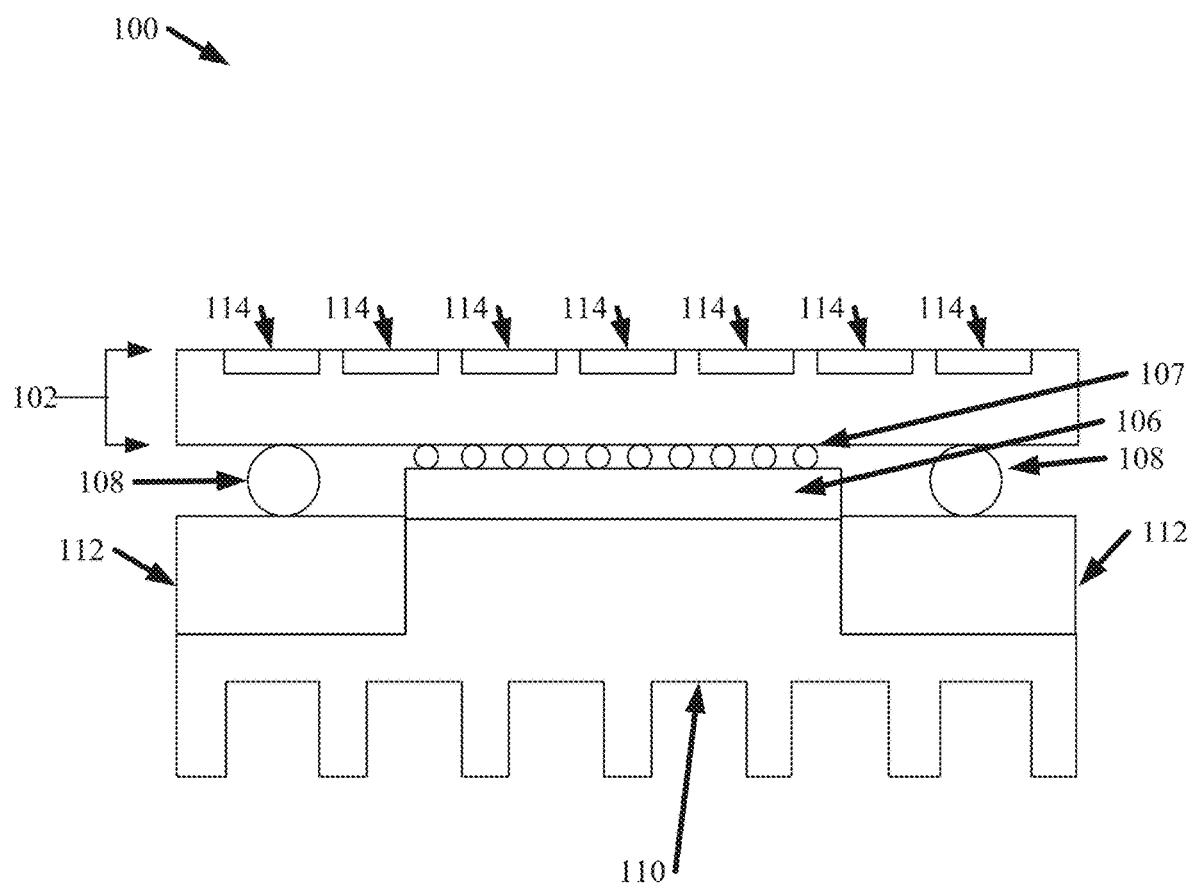
FIG. 1 illustrates a diagram of an example, non-limiting cross section of a phased array in accordance with one or more embodiments described herein.

FIG. 1 illustrates a diagram of an example, non-limiting cross section of a phased array 100 in accordance with one or more embodiments described herein. The phased array 100 can comprise an antenna-in-package substrate 102. The antenna-in-package substrate 102 can comprise a plurality of layers, which can form a core structure, an antenna structure, and/or an interface structure. The antenna-in package substrate 102 can be attached to one or more super dies 106 via one or more flip chip bump pads 107 and/or one or more ball grid array (BGA) terminals 108. Additionally, the one or more super die 106 can be attached to a heat sink 110 and/or a printed circuit board ("PCB") 112.

The core structure can be embedded within the antenna-in-package substrate 102 in one or more intermediate layers. The core structure can be adjacent to one or more ground planes and/or can be formed from a glass reinforced epoxy laminate material, such as FR-4. In one or more embodiments, the core structure can be formed from any material with similar mechanical and/or electrical properties as FR-4, such as materials used to construct PCBs 112. The antenna-in-package substrate 102 can comprise one or more radiating elements 114. The one or more radiating elements 114 can be located on one or more layers comprising the antenna-in-package substrate 102. For example, one or more first radiating elements 114 can be located on an uppermost layer of the antenna structure (e.g., as shown in FIG. 1) and one or more second radiating elements 114 can be located on one or more intermediate layers of the antenna structure. For instance, the antenna structure can be a probe fed stacked patch antenna structure. The interface structure can be located on an opposite side of the core structure than the antenna structure. One or more transmission lines 402 can be located on one or more layers comprising the interface structure. Thus, the antenna-in-package substrate 102 can comprise one or more embedded radiating elements 114 and/or one or more embedded transmission lines 402. Further, one of ordinary skill in the art will readily recognize that the plurality of layers comprising the antenna-in-package substrate 102 can further comprise one or more conductive layers, one or more insulating layers, and/or one or more vias to facilitate operation the phased array 100.

The one or more flip chip bump pads 107 can facilitate further attachment of the super die 106 to the antenna-in-package substrate 102 and/or provide structural integrity to the phased array 100. The one or more BGA terminals 108 can serve as one or more interfaces between various component of the phased array 100. For example, one or more soldering bumps can be positioned between the antenna-in-package substrate 102 and the one or more super dies 106 to facilitate attachment and provide mechanical support. The one or more soldering bumps can be provided by, for example, a reflow process.

Figure 2:
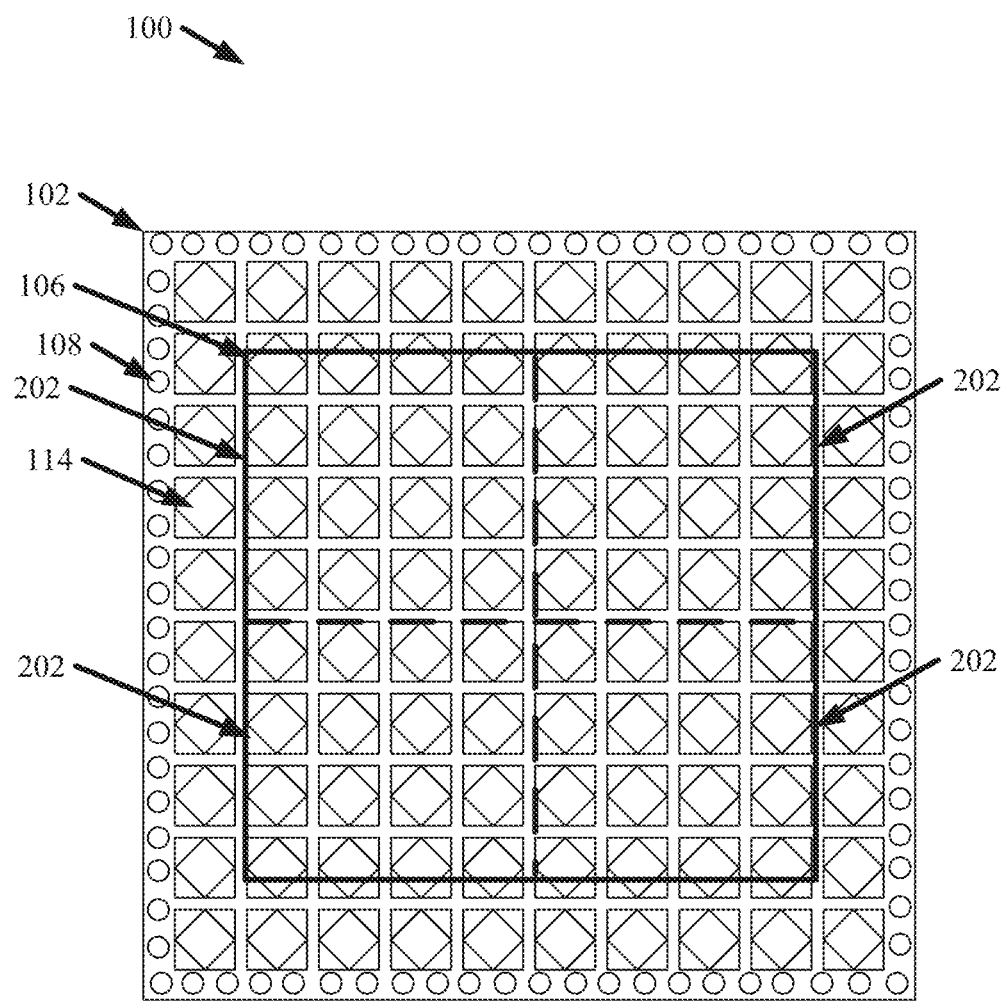
FIG. 2 illustrates a diagram of an example, non-limiting antenna package and/or circuit layout that can be included in one or more phased arrays in accordance with one or more embodiments described herein.

FIG. 2 illustrates a diagram of an example, non-limiting phased array 100 comprising the antenna-in-package substrate 102, the one or more super dies 106, and/or the one or more BGA terminals 108. Repetitive description of like elements employed in other embodiments described herein is omitted for sake of brevity.

As used herein, the term "super die" can regard a die that comprise multiples copies of one or more integrated circuits 202. Also, the one or more super dies 106 can be diced directly from a wafer. For example, a super die 106 can comprise greater than or equal to 2 integrated circuits 202. For instance, a super die 106 can comprise greater than or equal to 2 integrated circuits 202 and less than or equal to 64 integrated circuits 202. Also, a super die 106 can comprise a combination of transmitter integrated circuits 202 and/or receiver integrated circuits 202. For example, a super die 106 can comprise four integrated circuits 202 (e.g., as partially defined by dashed lines in FIG. 2), wherein two of the integrated circuits 202 can be transmitters and the remaining two integrated circuits 202 can be receivers. For instance, a 13.5 millimeter (mm) by 11.3 mm super die 106 can comprise four 6.7 mm by 5.6 mm integrated circuits 202. In another instance, a 27 mm by 22.6 mm super die 106 can comprise sixteen 6.7 mm by 5.6 mm integrated circuits 202.

The one or more integrated circuits 202 (e.g., comprising a super die 106) can be, for example, radio frequency integrated circuits ("RFIC"). Further, the one or more integrated circuits 202 can comprise one or more active circuit elements forming, for example, one or more receivers and/or one or more transmitters. Moreover, one of ordinary skill in the art will recognize that the one or more integrated circuits 202 can comprise respective flip chip pads, ground pads, DC power supply pads, input/output pads, and/or control signal pads.

In one or more embodiments, one or more super dies 106 can be flip chip attached to the antenna-in-package substrate 102, wherein a layout comprising the interface structure of the antenna-in-package substrate 102 can be configured to accommodate the super dies 106 as if it were a single-chip module. For example, the antenna-in-package substrate 102 can comprise one or more flip chip bump pads 107, which can be positioned so as to align with a layout of one or more flip chip pads comprising the one or more integrated circuits 202 of a respective super die 106.

Although FIG. 2 illustrates a phased array 100 comprising a super die 106 with four integrated circuits 202, the architecture described herein is not so limited. For example, the super die 106 can comprise fewer or additional integrated circuits 202 than the four shown.

FIG. 2 illustrate an antenna-in-package substrate 102 comprising 100 radiating elements 114 (e.g., which can be located on an opposite side of the antenna-in-package substrate 102 than the one or more super dies 106), of which, 64 can be active and 36 can be inactive. However, in one or more embodiments, the antenna-in-package substrate 102 can comprise more or less radiating elements 114 (e.g., including more or less active and/or inactive radiating elements 114). For example, the antenna-in-package substrate 102 can comprise greater than or equal to 2 radiating elements 114. For instance, the antenna-in-package substrate 102 can comprise greater than or equal to 16 radiating elements 114 and less than or equal to 1024 radiating elements 114. In one or more embodiments, the one or more BGA terminals 108 can be located surrounding a super die 106 (e.g., comprising one or more integrated circuits 202) with enough clearance for underfill of an electrically-insulative adhesive. For example, FIG. 2 shows 84 BGA terminals 108 surrounding the periphery of the antenna-in-package substrate 102. The number of BGA terminals 108 can vary depending on the size of the antenna-in-package substrate 102.

Figure 3A:
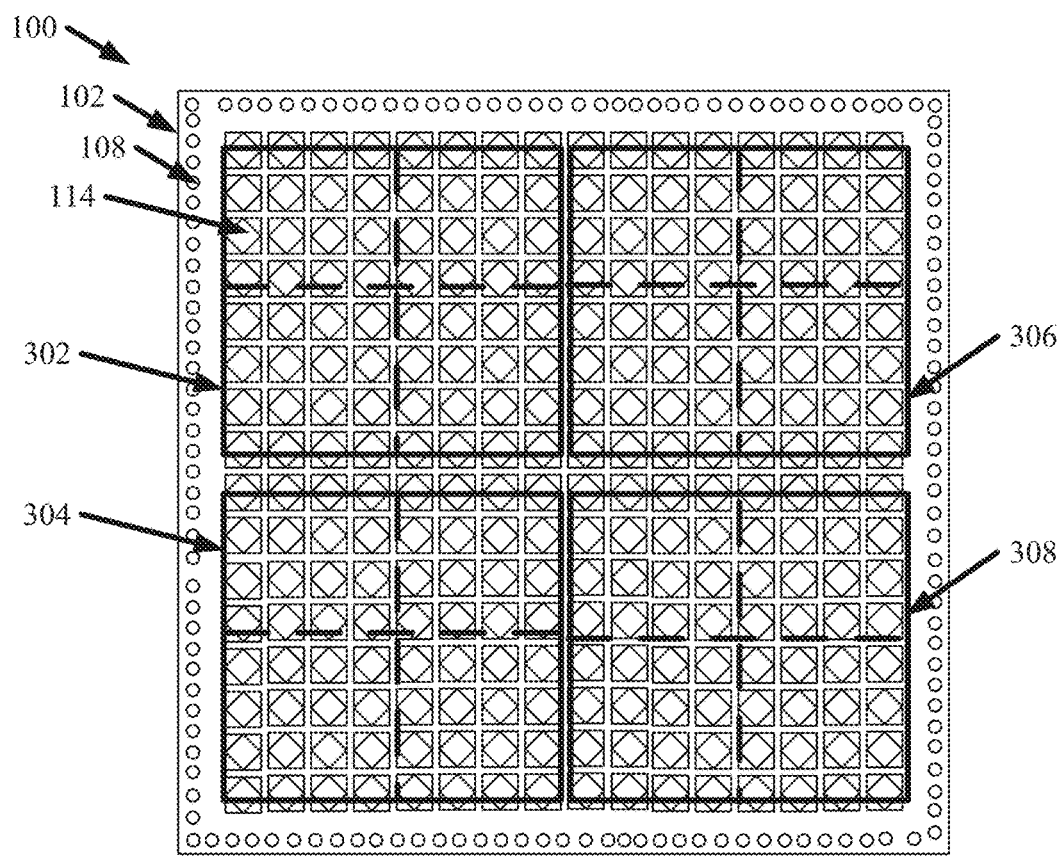
FIG. 3A illustrates a diagram of an example, non-limiting antenna package and/or circuit layout that can be included in one or more phased arrays in accordance with one or more embodiments described herein.
Figure 3B:
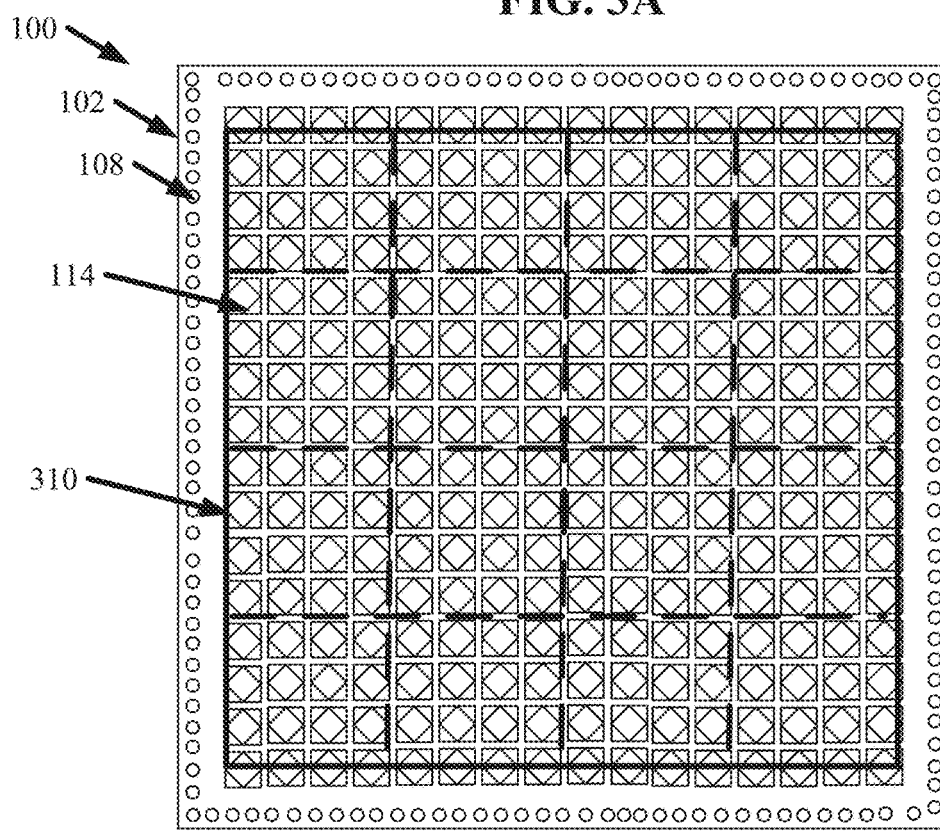
FIG. 3B illustrates a diagram of an example, non-limiting antenna package and/or circuit layout that can be included in one or more phased arrays in accordance with one or more embodiments described herein.

FIGS. 3A and 3B illustrate diagrams of example, non-limiting phased arrays 100 comprising the antenna-in-package substrate 102, one or more super dies 106, and/or the one or more BGA terminals 108. Repetitive description of like elements employed in other embodiments described herein is omitted for sake of brevity. The antenna-in-package substrate 102 of FIGS. 3A and 3B can comprise 256 radiating elements 114. In FIG. 3A the 256 radiating elements 114 can be activated by first super die 302, a second super die 304, a third super die 306, and/or a fourth super die 308. Each of the super dies 106 (e.g., first super die 302, second super die 304, third super die 306, and/or fourth super die 308) depicted in FIG. 3A can comprise a plurality of integrated circuits 202 (e.g., as partially defined by the dashed lines shown in FIG. 3A). For example, in one or more embodiments each super die 106 (e.g., first super die 302, second super die 304, third super die 306, and/or fourth super die 308) of FIG. 3A can comprise four integrated circuits 202; thereby the phased array 100 of FIG. 3A can comprise 16 integrated circuits 202. Additionally, while FIG. 3A illustrates a phased array 100 comprising four super die 106, a phased array 100 comprising less than or greater than four super die 106 is also envisaged. Moreover, wherein a phased array 100 comprises multiple super die 106, the super die 106 can have uniform dimensions with respect to each other and/or can have varying dimensions with respect to each other. An embodiment in which the phased array 100 comprises a plurality of super die 106 (e.g., as shown in FIG. 3A) has the advantage of readily incorporating multiple integrated circuits 202 at once with a single attachment per super die 106 as opposed to an attachment per integrated circuit 202.

In FIG. 3B the 256 radiating elements 114 can be activated by a single large super die 310 (e.g., a 27 mm by 22.6 mm super die 106), wherein the single large super die 310 can comprise a plurality of integrated circuits 202. For example, in one or more embodiments the single large super die 310 can comprise 16 integrated circuits 202 (e.g., as partially defined by the dashed lines shown in FIG. 3B). FIGS. 3A and 3B exemplify the scalable nature of the phased array 100 described herein. For example, the phased array 100 can be scaled to include multiple integrated circuits 202 via a single super die 106 and/or via a plurality of super dies 106.

Figure 4:
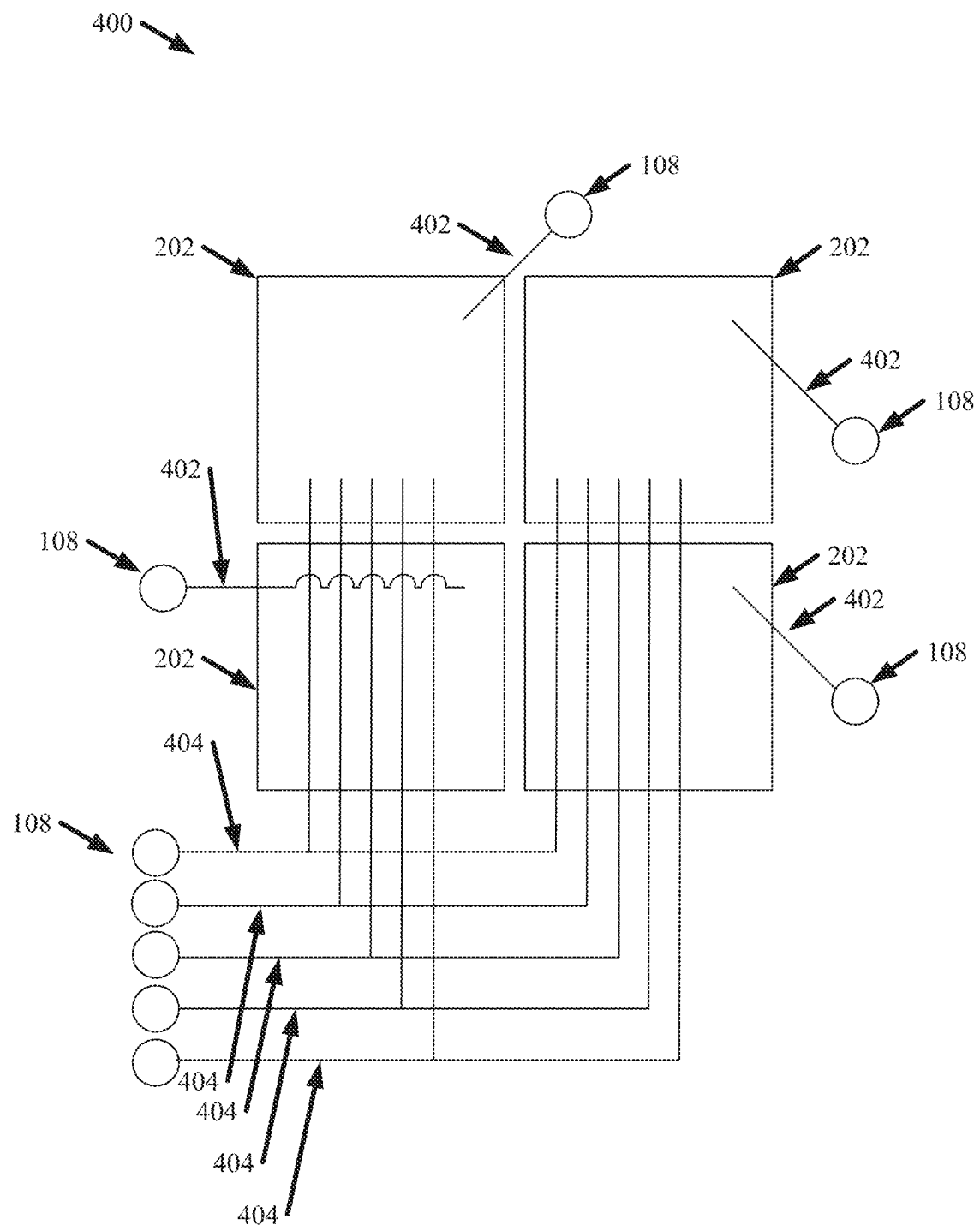
FIG. 4 illustrates a diagram of an example, non-limiting routing scheme that can be included in one or more phased arrays in accordance with one or more embodiments described herein.

FIG. 4 illustrates a diagram of an example, non-limiting routing scheme 400 for a super die 106 that can be included in a phased array 100 in accordance with one or more embodiments described herein. Repetitive description of like elements employed in other embodiments described herein is omitted for sake of brevity.

As shown in FIG. 4, each integrated circuit 202 of a super die 106 can be connected to a respective transmission line 402 of a plurality of transmission lines 402. The plurality of transmission lines 402 can be embedded within the antenna-in-package substrate 102 (e.g., on one or more layers comprising the interface structure of the antenna-in-package substrate 102). For each respective integrated circuit 202, one or more transmission lines 402 can operatively couple the respective integrated circuit 202 to a BGA terminal 108 (e.g., one or more BGA pads), which can serve as an interface between the respective integrated circuit 202 and one or more devices on the PCB 112 (e.g., a system application board). The plurality of transmission lines 402 can traverse one or more layers of the antenna-in-package substrate 102. For example, a respective transmission line 402 can traverse a single layer of the antenna-in-package substrate 102. In another example, a respective transmission line 402 can traverse a plurality of layers comprising the antenna-in-package substrate 102.

The plurality of transmission lines 402 can be stripline transmission lines. One or more transmission lines 402 can serve to transmit electromagnetic energy between one or more flip chip pads of a respective integrated circuit 202 and one or more radiating elements 114. Further, one or more transmission lines 402 can serve to transmit electromagnetic energy between one or more flip chip pads of a respective integrated circuit 202 and the PCB 112 (e.g., via one or more BGA pad interfaces). For example, one or more of the transmission lines 402 can carry a signal such as a modified frequency (e.g., an intermediate frequency) and/or a baseband power signal.

Additionally, each of the integrated circuits 202 can be operatively coupled to one or more BGA terminals 108 by one or more signal lines 404, wherein one or more BGA terminals 108 (e.g., BGA pads) can serve as another type of interface. The plurality of integrated circuits 202 can be connected to a common electrical digital system bus (e.g., via one or more signal lines 404). Sharing a common digital bus can save on BGA pin count on the antenna-in-package substrate 102 and reduce a package form factor. In one or more embodiments, the one or more signal lines 404 can also be embedded in the antenna-in-package substrate 102.

Figure 5:
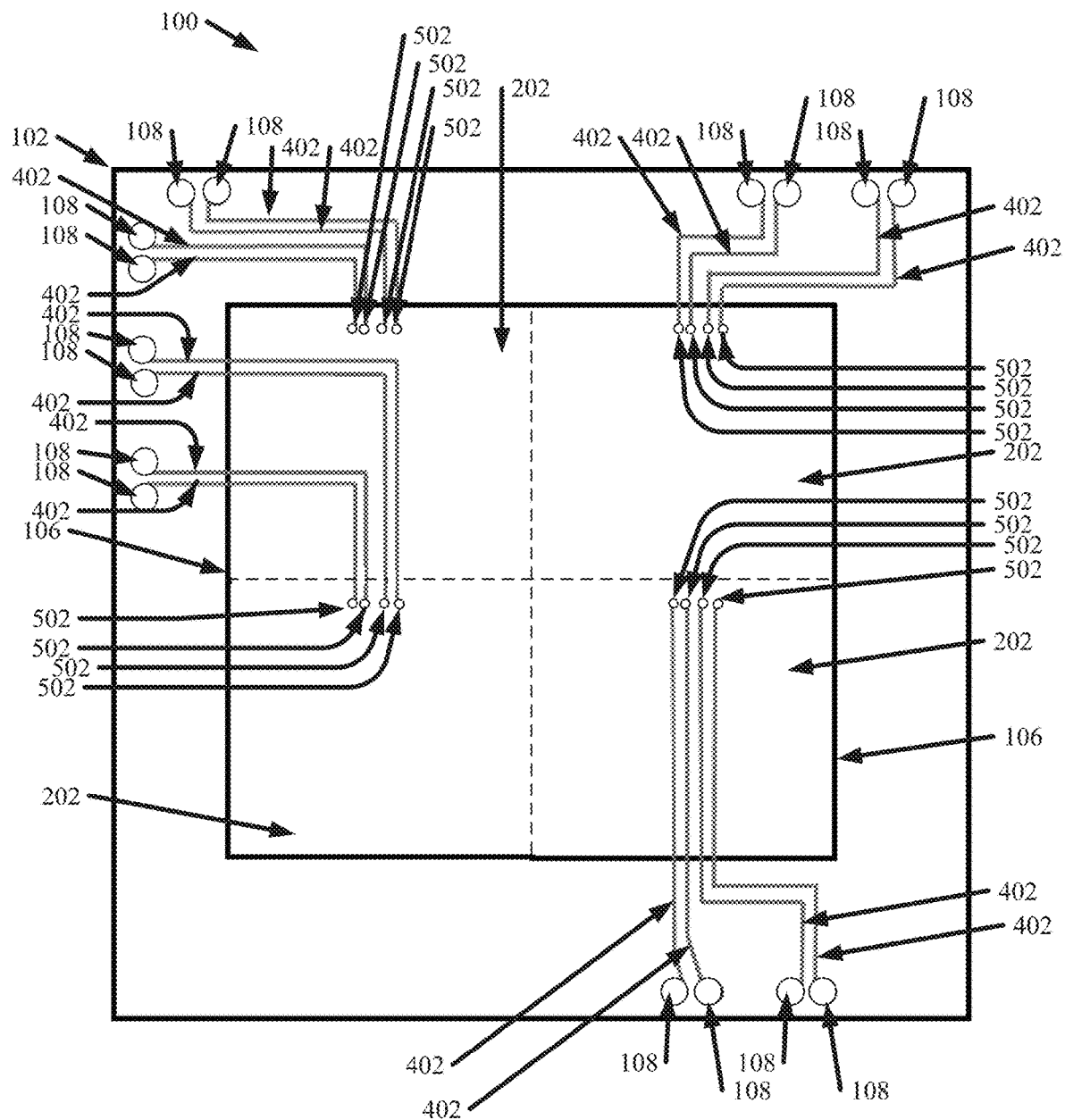
FIG. 5 illustrates a diagram of an example, non-limiting phased array in accordance with one or more embodiments described herein.

FIG. 5 illustrates a diagram of an example, non-limiting phased array 100 in accordance with one or more embodiments described herein. Repetitive description of like elements employed in other embodiments described herein is omitted for sake of brevity.

The exemplary phased array 100 shown in FIG. 5 can comprise a super die 106, which can comprise four integrated circuits 202 (e.g., at least partially defined by the dashed lines shown in FIG. 5). Each integrated circuit 202 can comprise one or more flip chip pads 502 to facilitate connection to the antenna-in-package substrate 102. Further, the respective flip chip pads 502 can be operably coupled to respective transmission lines 402 (e.g., via respective flip chip bump pads 107). For example, each integrated circuit 202 can be connected to two differential pairs of transmission lines 402 to transmit intermediate frequencies for horizontal and vertical polarization, respectively. In other words, for each integrated circuit 202, a plurality of transmission lines 402 can connect flip chip pads 502 on the respective integrated circuit 202 to the one or more BGA terminals 108 (e.g., four BGA pads) on the antenna-in-package substrate 102. Also, in one or more embodiments the plurality of transmission lines 402 connecting the plurality of integrated circuits 202 can all be embedded on the same layer of the antenna-in-package substrate 102. Thus, the phased array 100 of FIG. 5 can comprise four BGA terminals 108 (e.g., BGA pads) per integrated circuit 202, for a total of 16 BGA terminals 108, which can serve as interfaces with the PCB 112 (e.g., a system application board) for signal frequencies regarding the one or more radiating elements 114.

Figure 6:
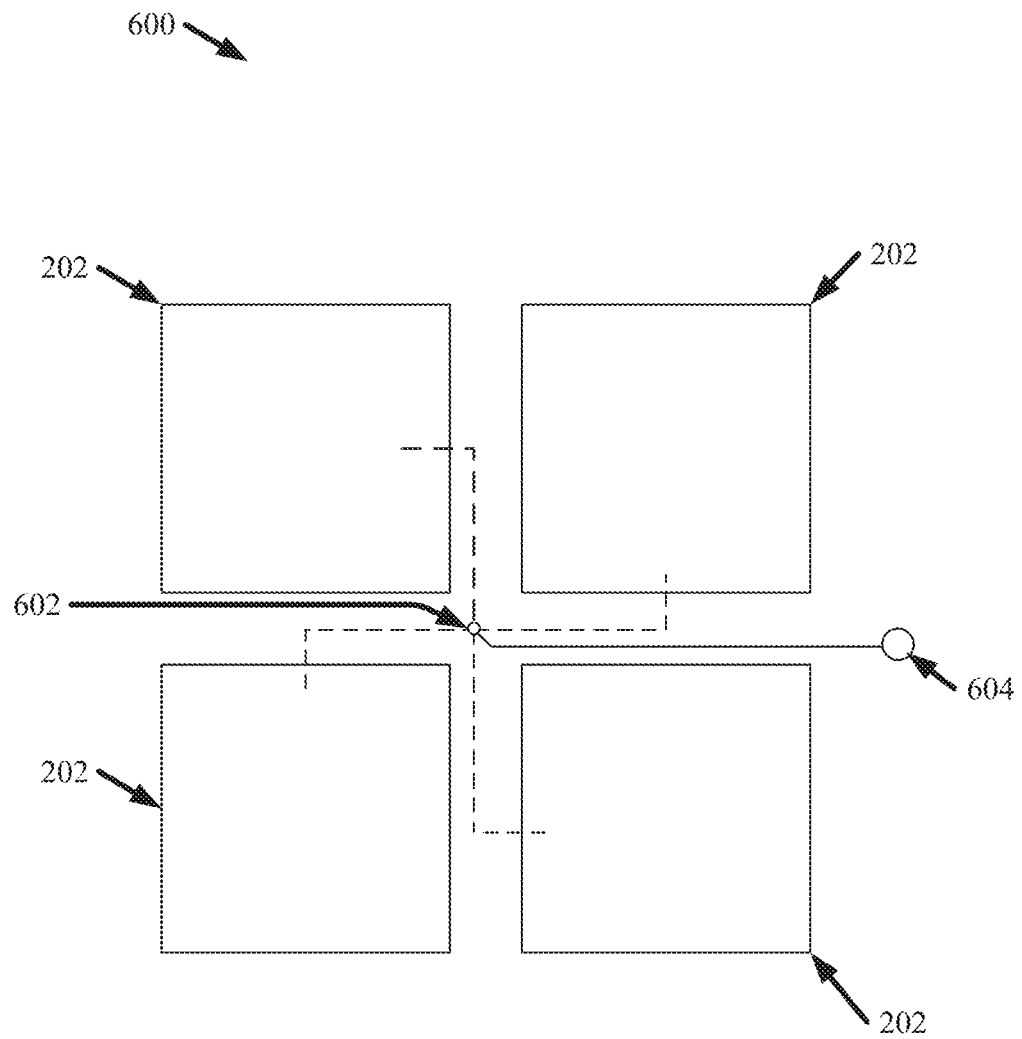
FIG. 6 illustrates another diagram of an example, non-limiting routing scheme that can be included in one or more phased arrays in accordance with one or more embodiments described herein.

FIG. 6 illustrates a diagram of another example, non-limiting routing scheme 600 in accordance with one or more embodiments described herein. Repetitive description of like elements employed in other embodiments described herein is omitted for sake of brevity. Routing scheme 600 can be implemented in a variety of phased array packages. For example, routing scheme 600 can be implemented in the phased array 100 described herein (e.g., a scalable phased array 100 comprising a plurality of integrated circuits 202 on a super die 106) and/or in a conventional phased array package. For instance, routing scheme 600 can be implemented in combination with an antenna-in-package substrate 102 and/or one or more BGA terminals 108 as described in one or more embodiments herein.

As shown in FIG. 6, routing scheme 600 comprises combining a plurality of transmission lines 402 into a single combined output. The plurality of integrated circuits 202 comprising routing scheme 600 can be located on a common die (e.g., a super die 106) and/or can be located on respective dies. Additionally, while FIG. 6 shows four integrated circuits 202, the architecture is not so limited. For example, routing scheme 600 can comprise fewer integrated circuits 202 than the four shown or can be scaled to include additional integrated circuits 202 than the four shown.

Routing scheme 600 can comprise a plurality of transmission lines 402, which can comprise at least two different types. Further, the plurality of transmission lines 402 can be embedded in the antenna-in-package substrate 102 as described with regard to one or more embodiments herein. For example, respective transmission lines 402 can traverse a common layer of the antenna-in-package substrate 102 and/or multiple layers of the antenna-in-package substrate 102. As shown in FIG. 6, a first type of transmission line 402 is represented by dashed lines and a second type of transmission line 402 is represented by solid lines. The plurality of first type of transmission lines 402 (e.g., represented by dashed lines) can extend from respective integrated circuits 202 to a combining point 602. The second type of transmission lines 402 (e.g., represented by a solid line) can extend from the combining point 602 to a combiner output 604.

In one or more embodiments, one or more first type of transmission lines 402 can extend from one or more flip chip pads 502 (e.g., and/or respective flip chip bump pads 107) of a first integrated circuit 202 to the combining point 602. Also, one or more first type of transmission lines 402 can extend from one or more flip chip pads 502 (e.g., and/or respective flip chip bump pads 107) of a second integrated circuit 202 to the combining point 602. Further, one or more first type of transmission lines 402 can extend from one or more flip chip pads 502 (e.g., and/or respective flip chip bump pads 107) of a third integrated circuit 202 to the combining point 602. Moreover, one or more first type of transmission lines 402 can extend from one or more flip chip pads 502 (e.g., and/or respective flip chip bump pads 107) of a fourth integrated circuit 202 to the combining point 602. A second type of transmission line 402 can extend from the combining point 602 to a combiner output 604, which can be coupled (e.g., via one or more embedded transmission lines 402) to one or more BGA terminals 108 (e.g., one or more BGA pads).

The combining point 602 can also be embedded within the antenna-in-package substrate 102 (e.g., within the interface structure). Further, the combining point 602 can be embedded in a single layer of the antenna-in-package substrate 102 or in multiple layers of the antenna-in-package substrate 102.

Wherein the two or more subject integrated circuits 202 joined by a combining point 602 are receiver integrated circuits 202, a signal flow can be directed from the integrated circuits 202 to the combiner output 604. For example, multiple signals (e.g., intermediate frequencies and/or baseband power signals) can be carried via a plurality of first type of transmission lines 402 to the combining point 602, which can serve to combine the multiple signals into a combined signal. One or more second type of transmission lines 402 can carry the combined signal to the combiner output 604, which can be operatively coupled (e.g., via one or more embedded transmission lines 402) to one or more BGA terminals 108 (e.g., one or more BGA pads).

Wherein the two or more integrated circuits 202 are transmitter integrated circuits 202, a signal flow can be directed from the combiner output 604 to the integrated circuits 202. For example, the combiner output 604 can serves as a splitter input, which receives a signal (e.g., an intermediate frequency and/or a baseband power signal). One or more second type of transmission lines 402 can carry the signal to the combining point 602 where the signal can be split. A plurality of first type of transmission lines 402 can carry the split signal to respective integrated circuits 202.

In other words, the combining point 602 can function to combine signals to form a common signal or split a common signal into multiple split signals depending on the direction of the signal flow (e.g., which can be dependent on whether the subject integrated circuits 202 are transmitter integrated circuits 202 or receiver integrated circuits 202). Also, the combiner output 604 can function to output a common signal or receive a common signal depending on the direction of the signal flow (e.g., which can be dependent on whether the subject integrated circuits 202 are transmitter integrated circuits 202 or receiver integrated circuits 202).

The first type of transmission lines 402 can have different impedance characteristics and/or lengths than the second type of transmission line 402 to achieve minimum insertion loss, wide bandwidth, and/or impedance matching at an interface. For instance, the first type of transmission lines 402 can have a high impedance than the second type of transmission lines 402. For example, the first type of transmission line 402 can have an impedance of 100 ohms ($\Omega$) and a length of $\lambda/4$, while the second type of transmission line 402 can have an impedance of 50$\Omega$ and any length. In another example, the first type of transmission line 402 can have an impedance of 50$\Omega$ and any length, while the second type of transmission line 402 can have an impedance of 25$\Omega$ and a length of $\lambda/4$. In another example, the first type of transmission line 402 can have an impedance of 70$\Omega$ and a length of $\lambda/4$, while the second type of transmission line 402 can have an impedance of 35$\Omega$ and a length of $\lambda/4$.

In one or more embodiments, the routing scheme 600 can comprise 'N+1' transmission lines 402 to combine 'N' flip chip pads from N integrated circuits 202 to a combiner output 604, wherein 'N' can be an integer greater than or equal to 2. Further, the plurality of transmission lines 402 comprising the routing scheme 600 can comprise 'N' transmission lines 402 of a first type, and 1 transmission line 402 of a second type. Wherein the first type of transmission lines 402 can have different impedance and/or length characteristics than the second type of transmission line 402. For example, the first type of transmission lines 402 can have larger impedance than the second type of transmission line 402. The N first type of transmission lines 402 can extend from the N integrated circuits 202 to one or more combining points 602. Also, the second type of transmission line 402 can extend from the one or more combining points 602 to the combiner output 604.

A conventional technique for combining and/or splitting a signal via a plurality of transmission lines 402 utilizes a Wilkinson combiner. However, a Wilkinson combiner comprises a resistor, which can inhibit embedment of the routing scheme 600 within the antenna-in-package substrate 102. One or more embodiments described herein, can utilize one or active signal amplifiers to alleviate necessity of a resistor in the Wilkinson combiner. For example, the plurality of transmission lines 402 can comprise two quarter wave transformers with an impedance of $\sqrt{2} Z_0$ and a length of $\lambda/4$, wherein '$Z_0$' can be the output impedance of the plurality of integrated circuits 202. Without the need for a resistor at the combining point 602, the plurality of transmission lines 402 can be combined within the antenna-in-package substrate 102; thereby enabling more flexible and simpler layouts than can otherwise be achieved via conventional techniques. In one or more embodiments, four input signals (e.g., four transmission lines 402) can be combined via two cascaded two-input combiners (e.g., two combining points 602), each having a $\sqrt{2} Z_0$ characteristic impedance. In one or more other embodiments, four input signals (e.g., four transmission lines 402) can be combined via a four-way combiner (e.g., a combining point 602) having a $\sqrt{4} Z_0$ characteristic impedance.

In the Wilkinson combiner, the resistor can provide input matching for differential mode excitation. However, in one or more embodiments described herein, the one or more inputs to the combining point 602 can be driven by one or more active signal amplifiers 806 (e.g., located on respective integrated circuits 202), which have good (e.g., matching) isolation, thereby minimizing the impact of reflection at differential modes. For example, the plurality of integrated circuits 202 can comprise one or more signal amplifiers having a load resistor that matches the impedance of inputs to a subject combining point 602. For instance, in one or more embodiments both the load resistor and the inputs (e.g., transmission lines 402) to a subject combining point 602 can be characterized by 50Ω.

Thus, the routing scheme 600 can facilitate impedance transformation as well as signal combining and/or splitting. For example, absent routing scheme 600 (e.g., absent the plurality of transmission lines 402 (such as the first type of transmission lines 402 and/or the second type of transmission lines 402), the second type of transmission lines 402, the combining point 602, the combiner output 604, and/or the one or more signal amplifiers), combining N integrated circuits 202, each having output signals with an impedance of $Z_0$, would result in a combined signal having an impedance of $Z_0/N$, which can exhibit significant insertion loss when meeting an interface with the PCB 112 (e.g., via the BGA terminals 108). However, the features of routing scheme 600 described herein enable impedance transformation along with combination and/or splitting of a signal so as to match impedance at the interface with the PCB 112 and minimize insertion loss (e.g., routing scheme 600 can facilitate a combined signal output to the interface with an impedance of $Z_0$ rather than $Z_0/N$). Therefore, so long as the impedance shown from the combining point 602 input is $Z_0$ and the impedance shown from the combiner output 604 is $Z_0$, the number of joined integrated circuits 202 can be scaled to a desirable amount. In addition, routing scheme 600 can facilitate symmetric combining amongst the plurality of transmission lines 402.

Figure 7:
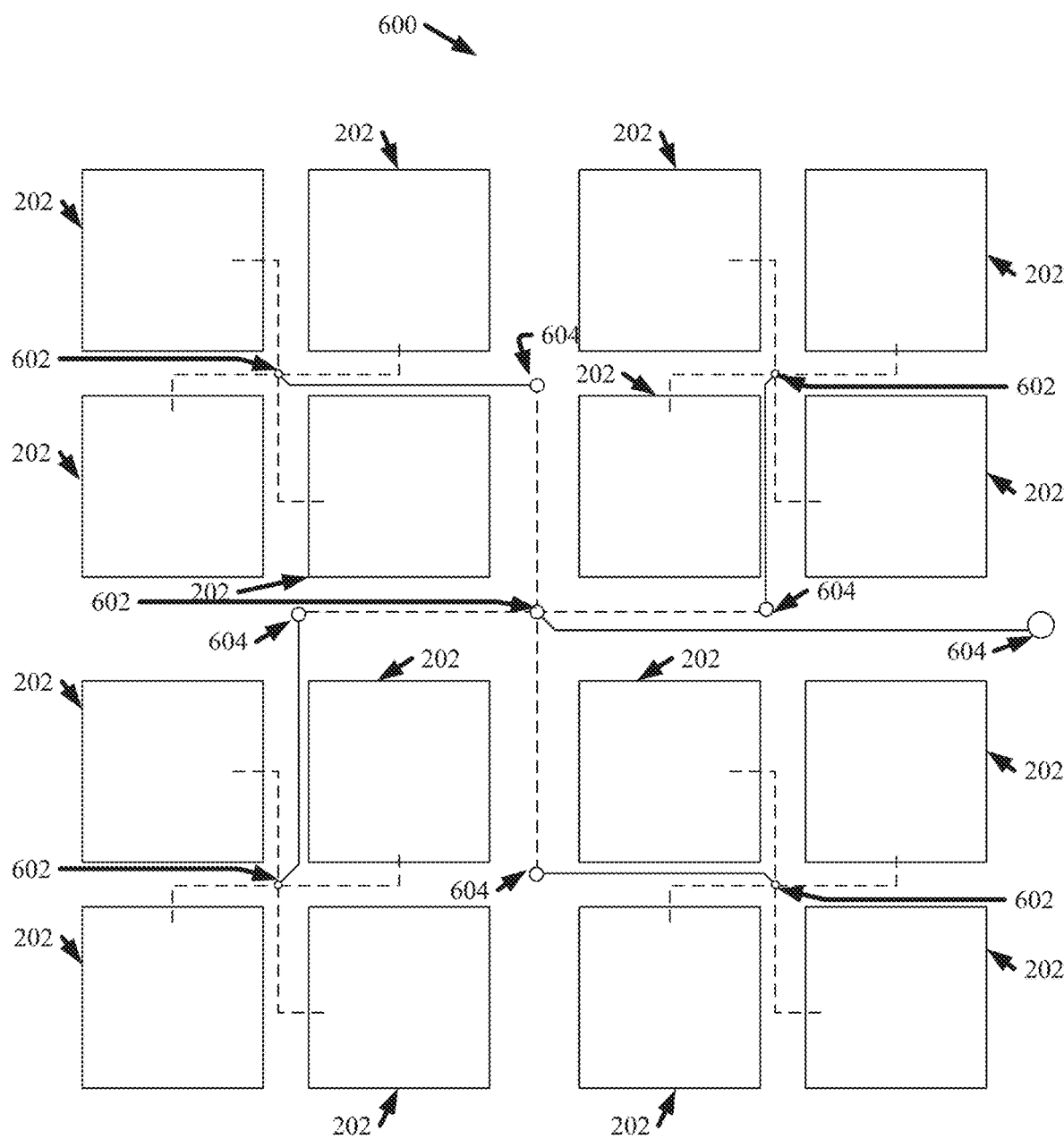
FIG. 7 illustrates a diagram of an example, non-limiting routing scheme that can be included in one or more phased arrays in accordance with one or more embodiments described herein.

FIG. 7 illustrates a diagram of the example, non-limiting routing scheme 600 scaled to comprise additional integrated circuits 202. Repetitive description of like elements employed in other embodiments described herein is omitted for sake of brevity. Routing scheme 600 shown in FIG. 7 can be implemented in a variety of phased array packages. For example, routing scheme 600, as shown in FIG. 7, can be implemented in the phased array 100 described herein (e.g., a scalable phased array 100 comprising a plurality of integrated circuits 202 on a super die 106) and/or in a conventional phased array package. For instance, routing scheme 600, as shown in FIG. 7, can be implemented in combination with an antenna-in-package substrate 102 and/or BGA terminal 108 as described in one or more embodiments herein.

As shown in FIG. 7, the structure of routing scheme 600 shown in FIG. 6 can be repeated so as to accommodate additional integrated circuits 202 (e.g., a total of 16 integrated circuits 106). FIG. 7 exemplifies the scalability of routing scheme 600 through repeating principles and/or structural features. Further, while 16 integrated circuits 202 are shown in FIG. 7, one of ordinary skill in the art will readily recognize that the scalable nature (e.g., repetition design) of routing scheme 600 can join few or more integrated circuits 202 than the 16 shown.

As shown in FIG. 7, dashed lines can represent a plurality of first type of transmission lines 402, a solid line can represent a plurality of second type of transmission lines 402, and/or a dotted line can represent a third type of transmission line 402. The plurality of first type of transmission lines 402 can extend from flip chip pads 502 located on respective integrated circuits 202 to one or more combining points 602. For example, a respective combining point 602 can join greater than or equal to 2 signal inputs and less than or equal to 16 signal inputs, such as four first type of transmission lines 402. A respective second type of transmission line 402 from the plurality of second type of transmission lines 402 can extend from a combining point 602 to a combiner output 604. For example, the another combining point 602 can join four second type of transmission lines 402. Additionally, the first type of transmission line 402 can extend from one or more combiner outputs 604 to one or more combining points 602. The impedance and/or length of the first type of transmission line 402 and/or the second type of transmission line 402 can vary between each type. For example, the first type of transmission lines 402 can have a greater impedance than the second type of transmission lines 402. In accordance with the scaled routing scheme 600 of FIG. 7, four signals (e.g., from four respective integrated circuits 202) can be joined to form a combined signal, which can subsequently be joined with three other combined signals to form a common signal. An embodiment in which one or more transmission lines 402 connect one or more combiner outputs 604 to one or more additional combining points 602 has the advantage of incorporating additional integrated circuits 202 while controlling impedance matching and minimizing insertion loss.

Figure 8A:
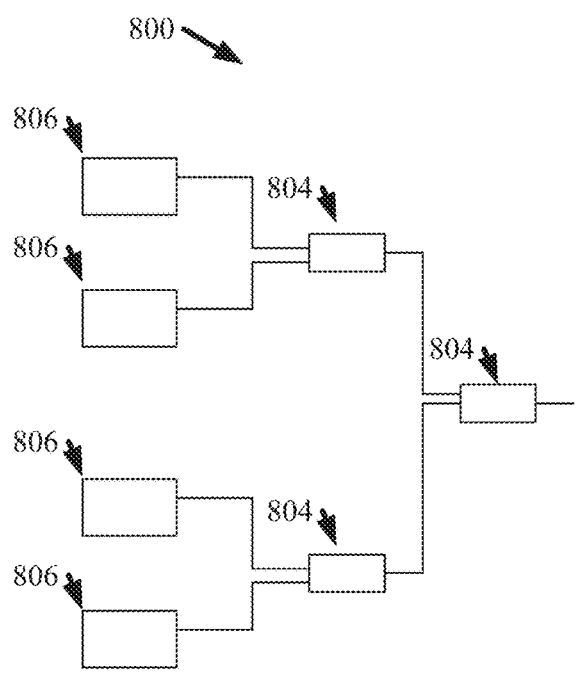
FIG. 8A illustrates a diagram of an example, non-limiting layout that can facilitate testing of one or more routing schemes accordance with one or more embodiments described herein.
Figure 8B:
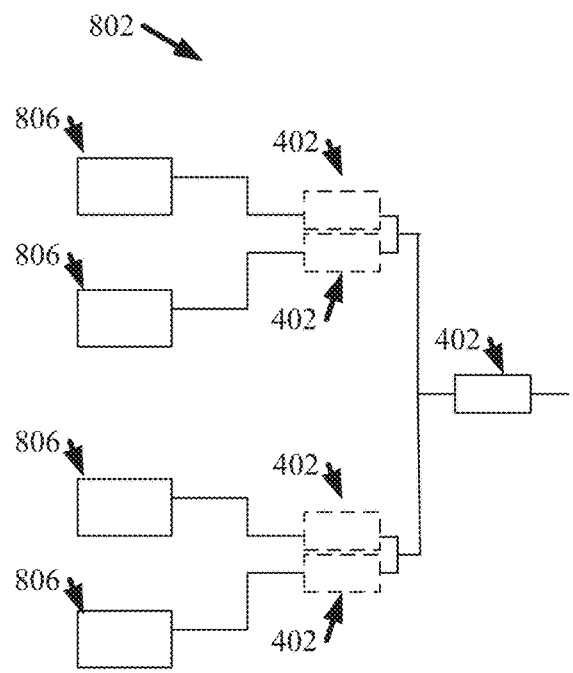
FIG. 8B illustrates another diagram of another example, non-limiting layout that can facilitate testing of one or more routing schemes accordance with one or more embodiments described herein.

FIGS. 8A and 8B illustrate diagrams of example, non-limiting layout 800 and/or layout 802 that can be utilized to demonstrate the efficacy of routing scheme 600 in accordance with one or more embodiments described herein. Repetitive description of like elements employed in other embodiments described herein is omitted for sake of brevity. Layout 800 and layout 802 can be utilized exemplify the efficacy of routing scheme 600 as compared to conventional techniques. Layout 800 and/or 802 can be implemented in a variety of phased array packages. For example, layout 800 and/or 802 can be implemented in the phased array 100 described herein (e.g., a scalable phased array 100 comprising a plurality of integrated circuits 202 on a super die 106) and/or in a conventional phased array package. For instance, layout 800 and/or layout 802 can be implemented in combination with an antenna-in-package substrate 102 and/or BGA terminal 108 as described in one or more embodiments herein.

Layout 800 comprise a plurality of Wilkinson combiners 804, which comprise resistors. Layout 802 comprises a plurality of transmission lines 402 as described herein (e.g., with regard to FIG. 6), wherein the dashed lines can represent the first type of transmission lines 402 and the solid lines can represent the second type of transmission lines 402. Further, each layout 800 and 802 can comprise a plurality of signal amplifiers 806 (e.g., located on respective integrated circuits 106) having a well-defined resistance (e.g., 50Ω) and/or good isolation (e.g., resulting in signal flow lower than −30 decibel (db)). Layout 800 can be designed in accordance with conventional techniques, whereas layout 802 can designed in accordance with one or more embodiments described herein (e.g., routing scheme 600 shown in FIGS. 6 and 7). Moreover, layout 802 can be exercised via at least two implementations. In a first implementation, the first type of transmission lines 402 can have an impedance of 50Ω and any length, while the second type of transmission line 402 can have an impedance of 25Ω and a length of λ/4. In the second implementation, the first type of transmission lines 402 can have an impedance of 70Ω and a length of λ/4, while the second type of transmission line 402 can have an impedance of 30Ω and a length of λ/4.

Figure 9:
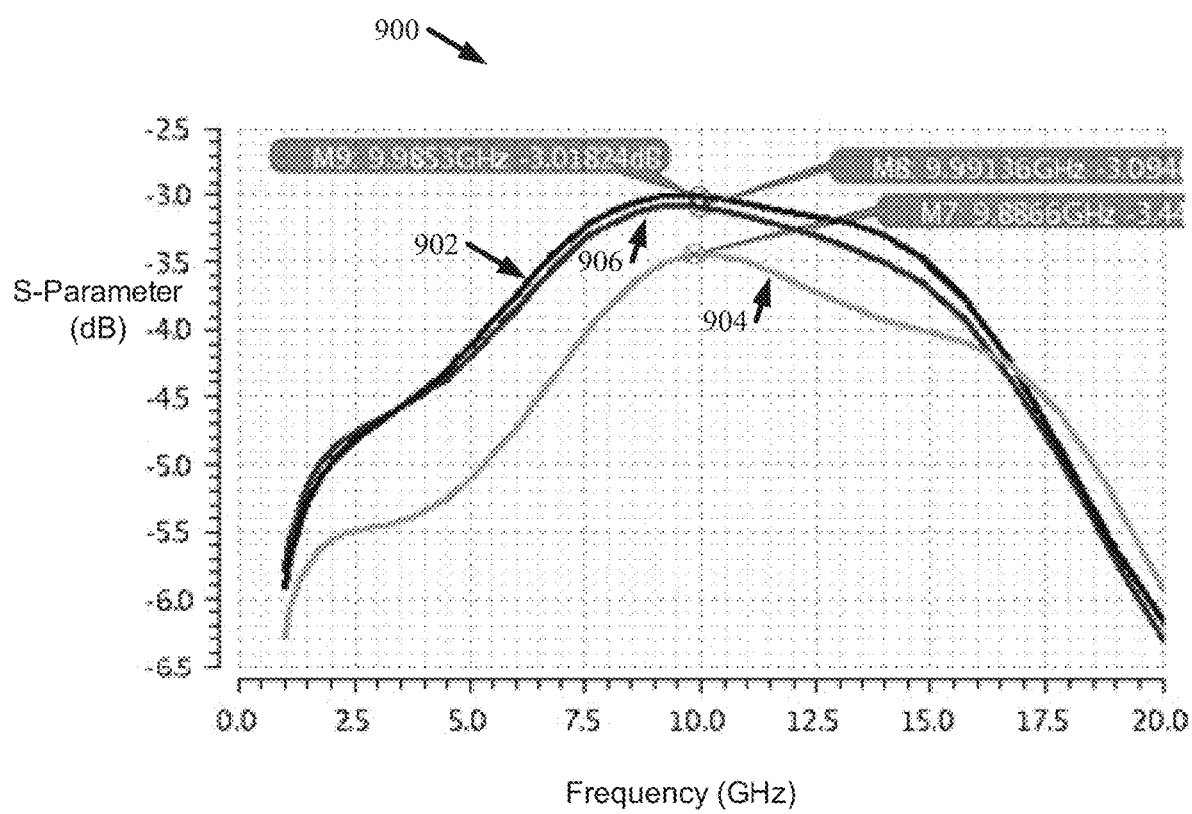
FIG. 9 illustrates a chart of an example, non-limiting graph regarding one or more testing conditions regarding frequency integration in accordance with one or more embodiments described herein.

FIG. 9 illustrates a diagram of an example, non-limiting graph 900 regarding single-path insertion loss exhibited by layout 800 and layout 802. Repetitive description of like elements employed in other embodiments described herein is omitted for sake of brevity. Line 902 depicts single-path insertion loss exhibited by layout 800. Line 904 depicts single-path insertion loss exhibited by the first implementation of layout 802. Line 906 depicts single-path insertion loss exhibited by the second implementation of layout 802.

Figure 10:
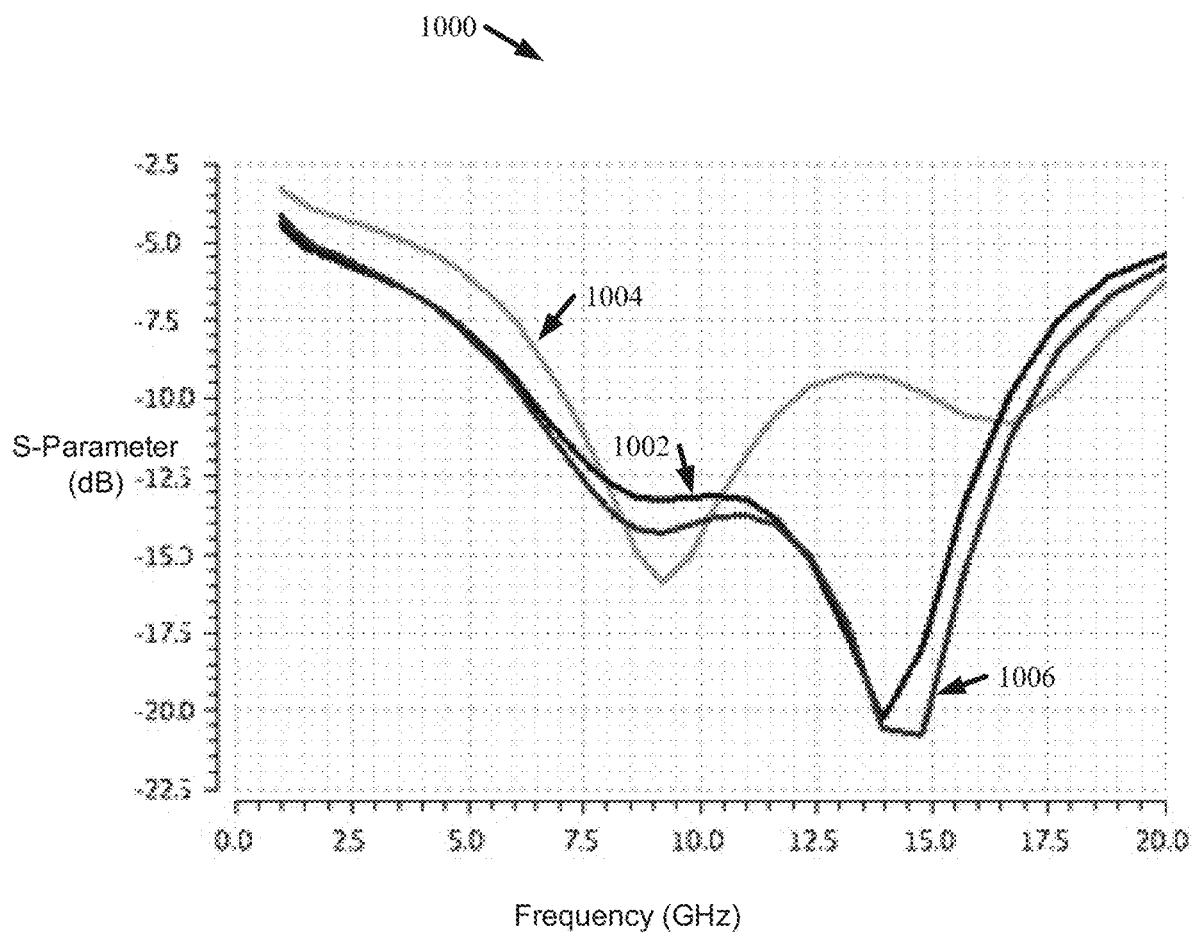
FIG. 10 illustrates a chart of an example, non-limiting graph regarding one or more testing conditions regarding frequency integration in accordance with one or more embodiments described herein.

FIG. 10 illustrates a diagram of an example, non-limiting graph 1000 regarding output return loss exhibited by layout 800 and layout 802. Repetitive description of like elements employed in other embodiments described herein is omitted for sake of brevity. Line 1002 depicts output return loss exhibited by layout 800. Line 1004 depicts output return loss exhibited by the first implementation of layout 802. Line 1006 depicts output return loss exhibited by the second implementation of layout 802.

Figure 11:
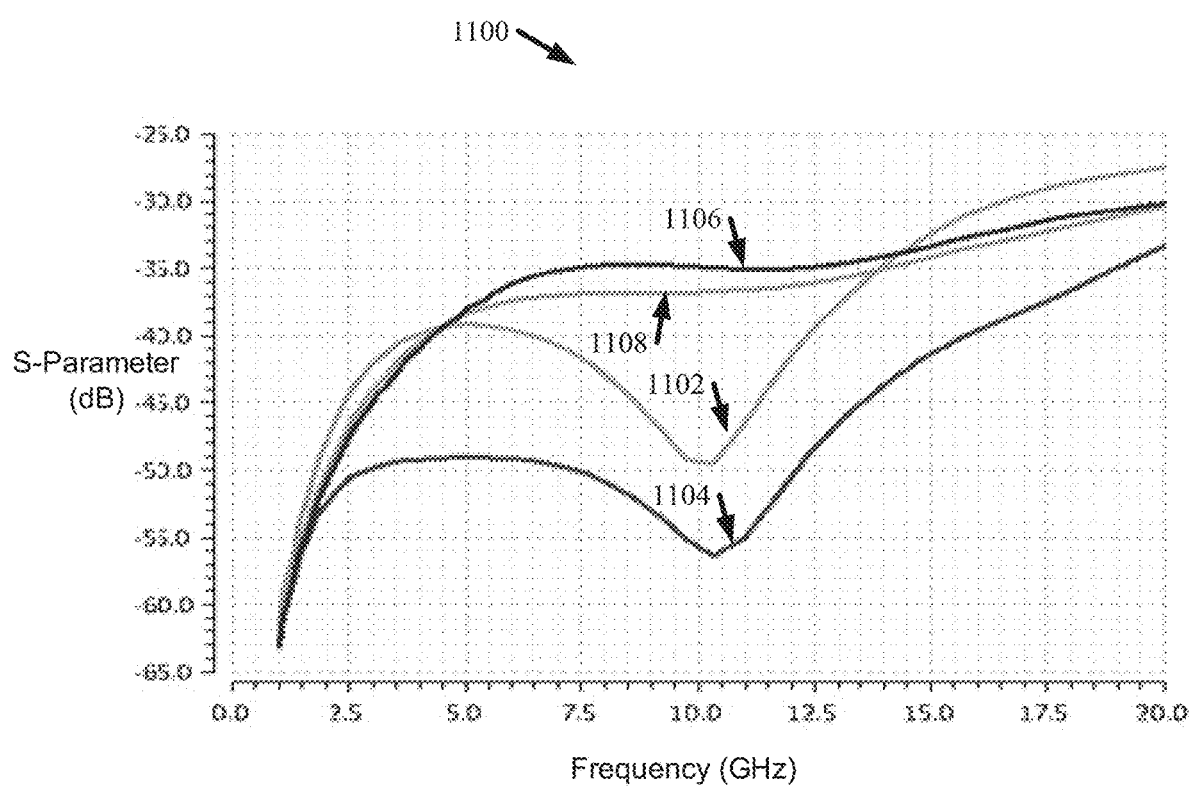
FIG. 11 illustrates a chart of an example, non-limiting graph regarding one or more testing conditions regarding frequency integration in accordance with one or more embodiments described herein.

FIG. 11 illustrates a diagram of an example, non-limiting graph 1100 regarding isolation exhibited by layout 800 and layout 802. Repetitive description of like elements employed in other embodiments described herein is omitted for sake of brevity. Line 1102 depicts isolation exhibited by layout 800 on the same branch. Line 1104 depicts isolation exhibited by layout 800 on another branch. Line 1106 depicts isolation exhibited by the first implementation of layout 802. Line 1108 depicts isolation exhibited by the second implementation of layout 802.

Figure 12:
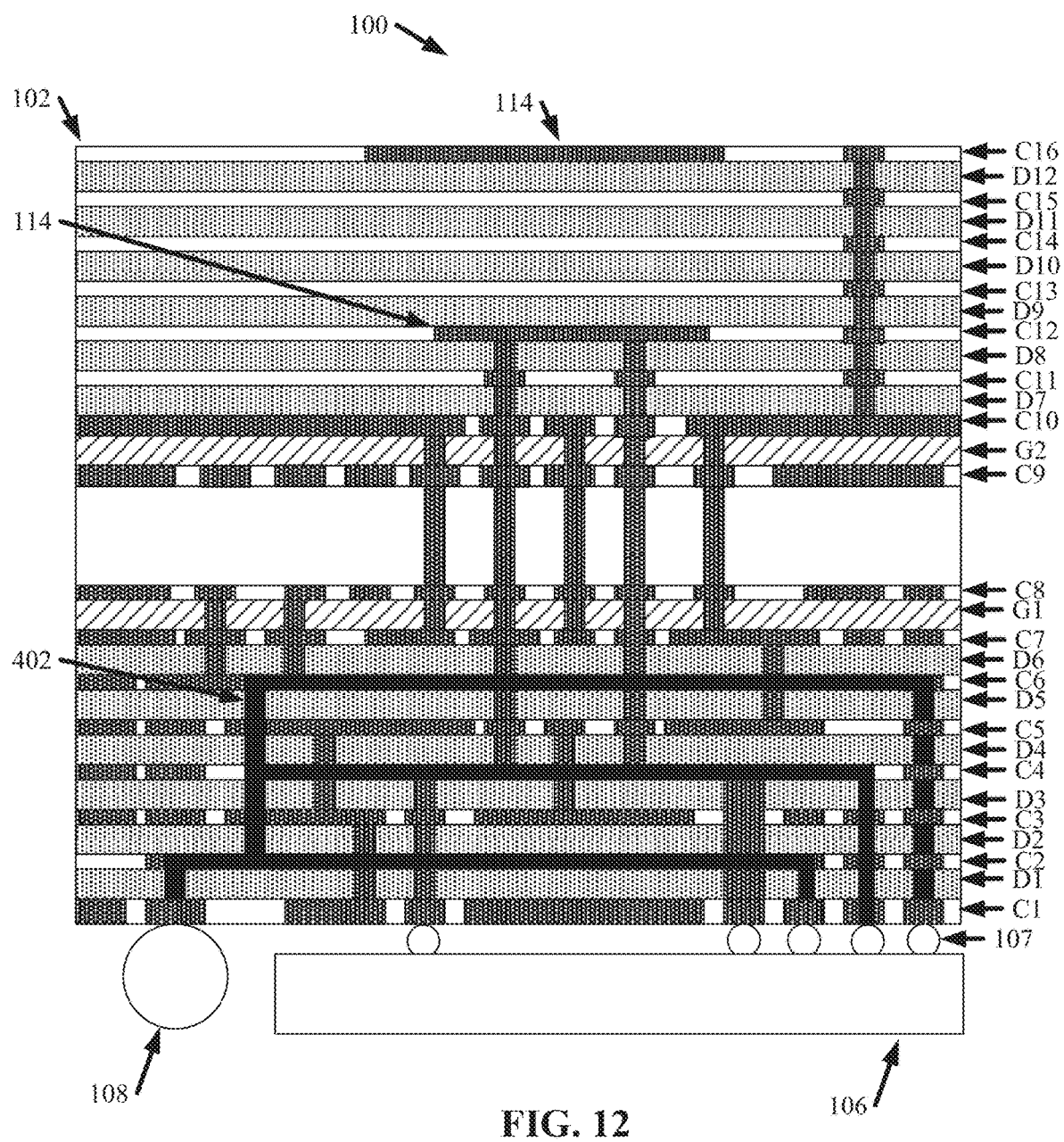
FIG. 12 illustrates a diagram of an example, non-limiting cross section of a phased array in accordance with one or more embodiments described herein

FIG. 12 illustrates a diagram of an example, non-limiting cross section of a portion of phased array 100 in accordance with one or more embodiments described herein. Repetitive description of like elements employed in other embodiments described herein is omitted for sake of brevity. FIG. 12 shows the plurality of layers that can comprise the antenna-in-package substrate 102 and/or exemplifies how a plurality of transmission lines 402 can be embedded in the antenna-in-package substrate 102 in accordance with routing scheme 600 to join a plurality of integrated circuits 202. One or more embodiments of the structure shown in FIG. 12 can be implemented in a variety of phased array packages. For example, one or more embodiments of the structure shown in FIG. 12 can be implemented in the phased array 100 described herein (e.g., a scalable phased array 100 comprising a plurality of integrated circuits 202 on a super die 106) and/or in a conventional phased array package. For instance, the structure exemplified in FIG. 12 can be implemented in combination with an antenna-in-package substrate 102 and/or BGA terminals 108 as described in one or more embodiments herein.

As shown in FIG. 12, the antenna-in-package substrate 102 can comprise a plurality of layers, which can comprise: one or more conductive layers (e.g., C1, C2, C3, C4, C5, C6, C7, C8, C9, C10, C11, C12, C13, C14, C15, and/or C16), one or more dielectric insulating layers (e.g., D1, D2, D3, D4, D5, D6, D7, D8, D9, D10, D11, and/or D12), and/or more ground planes (e.g., G1 and/or G2). An interface structure of the antenna-in-package substrate 102 can comprise conductive layers C1-C8, dielectric layers D1-D6, and/or ground plane G1. An antenna structure of the antenna-in-package substrate 102 can comprise conductive layers C9-C16, dielectric layers D7-D12, and/or ground plane G2. The number of layers shown in FIG. 12 is exemplary and one of ordinary skill in the art will readily recognize that an antenna-in-package substrate 102 can comprise a fewer or greater number of layers. Further, one of ordinary skill in the art will readily recognize that a variety of features (e.g., vias, power planes, feed line structures, a combination thereof, and/or the like) can be embedded within one or more of the layers comprising the antenna-in-package substrate 102.

FIG. 12 further exemplifies routing scheme 600 in which a plurality of transmission lines 402 can be combined within the antenna-in-package substrate 102. For example, conductive layers C6, C4, and/or C2 can serve as combining layers. Multiple transmission lines 402 can traverse the same layer of the antenna-in-package substrate 102 and/or respective transmission lines 402 can traverse respective layers of the antenna-in-package substrate 102 (e.g., one or more transmission lines 402 traversing a first layer and one or more transmission lines 402 traversing a second layer). Further, the plurality of transmission lines 402 can combine to form a single combined output, which can connect to the one or more BGA terminals 108 (e.g., a BGA pad) serving as an interface.

Figure 13:
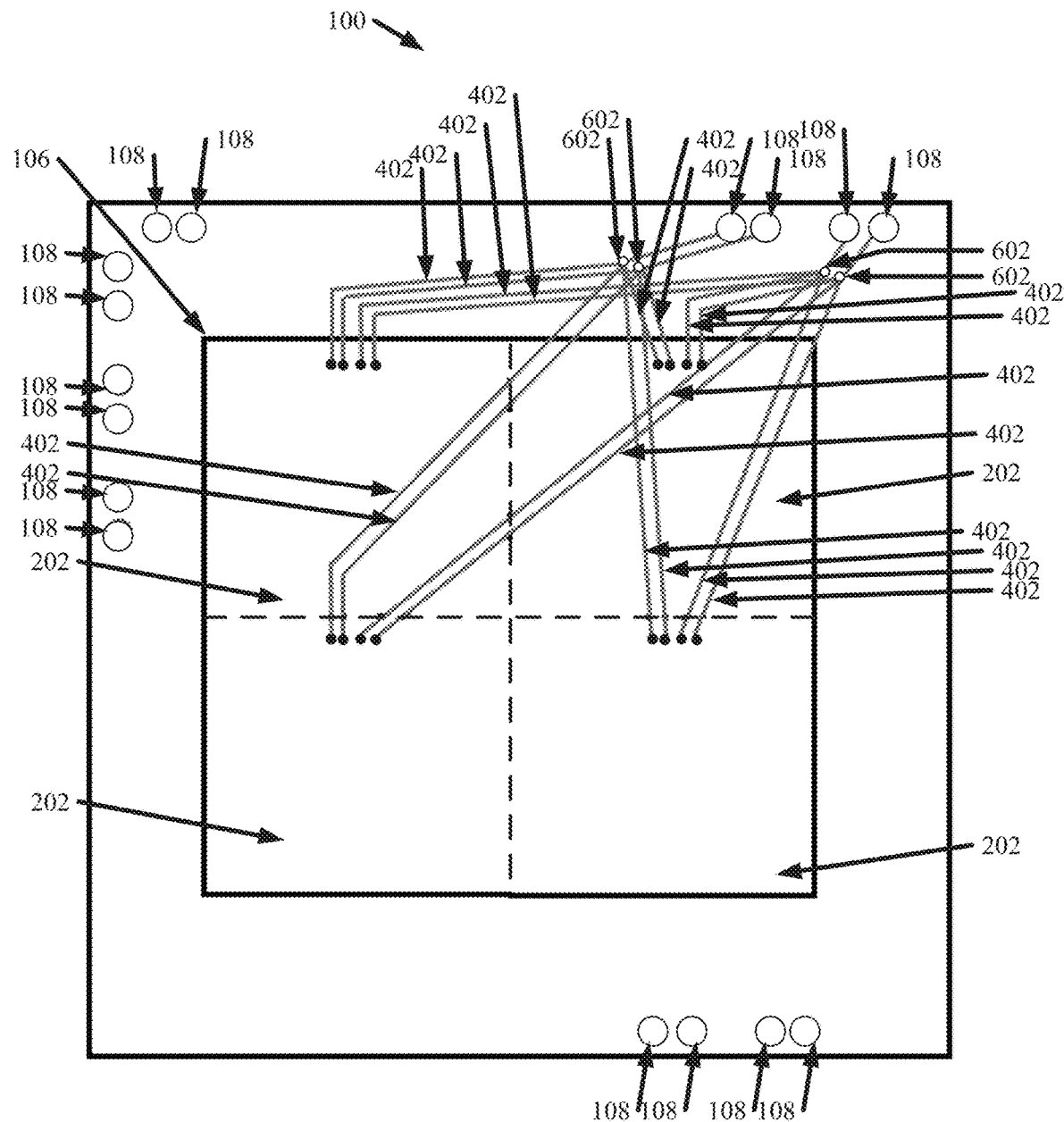
FIG. 13 illustrates a diagram of an example, non-limiting phased array in accordance with one or more embodiments described herein.

FIG. 13 illustrates a diagram of an example, non-limiting phased array 100 in accordance with one or more embodiments described herein. Repetitive description of like elements employed in other embodiments described herein is omitted for sake of brevity. The phased array 100 depicted in FIG. 13 can comprise the routing scheme 600. For example, the phased array 100 of FIG. 13 can comprise a plurality of integrated circuits 202 (e.g., located on respective die or on a super die 106 as described herein with regard to FIG. 5) connected to a plurality of transmission lines 402 embedded in the antenna-in-package substrate 102 in accordance with routing scheme 600, for example, as exemplified by the cross section shown in FIG. 12. As shown in FIG. 13, flip chip pads 502 are illustrated as black circles.

One or more embodiments of the structure shown in FIG. 13 can be implemented in a variety of phased array packages. For example, one or more embodiments of the structure shown in FIG. 13 can be implemented in the phased array 100 described herein (e.g., a scalable phased array 100 comprising a plurality of integrated circuits 202 on a super die 106) and/or in a conventional phased array package. For instance, the structure exemplified in FIG. 13 can be implemented in combination with an antenna-in-package substrate 102 and/or BGA terminal 108 as described in one or more embodiments herein.

For example, a first set of transmission lines 402 (e.g., for horizontal and/or vertical polarization) connected to a first integrated circuit 202 and a second set of transmission line 402 connected to a second integrated circuit 202 can both traverse a first layer (e.g., conductive layer C6) of the antenna-in-package substrate 102. Additionally, a third set of transmission lines 402 connected to a third integrated circuit 202 can traverse a second layer (e.g., conductive layer C4) of the antenna-in-package substrate 102. Further, a fourth set of transmission lines 402 connected to a fourth integrated circuit 202 can traverse a third layer (e.g., conductive layer C2) of the antenna-in-package substrate 102. The first set of transmission lines 402, the second set of transmission lines 402, the third set of transmission lines 402, and/or the fourth set of transmission lines 402 can be joined at a combining point 602, which can comprise one or more vias that can extend through a plurality of layers (e.g., conductive layers C2, C3, C4, C5, and/or C6 and/or dielectric layers D2, D3, D4, and/or D5) of the antenna-in-package substrate 102. Thus, the plurality of transmission lines 402 can be joined within the antenna-in-package substrate 102 to form a combined transmission line 402, which can extend to the one or more BGA terminals 108 (e.g., one or more BGA pads) interface.

FIG. 13 depicts how the routing scheme 600 can reduce the number of required BGA terminals 108 (e.g., BGA pads) serving as interfaces for frequency signals by combining a plurality of transmission lines 402 into a single output transmission line 402 that can connect to the one or more BGA terminals 108. For example, FIG. 5 illustrates a phased array 100 comprising four integrated circuits 202 without incorporating routing scheme 600 and requires 16 BGA terminals 108 (e.g., BGA pads), which serve as interfaces for frequency signals; wherein FIG. 13 illustrates a phased array 100 comprising four integrated circuits 202 joined by routing scheme 600 and requires 4 BGA terminals 108 (e.g., BGA pads), which serve as interfaces for frequency signals.

Figure 14:
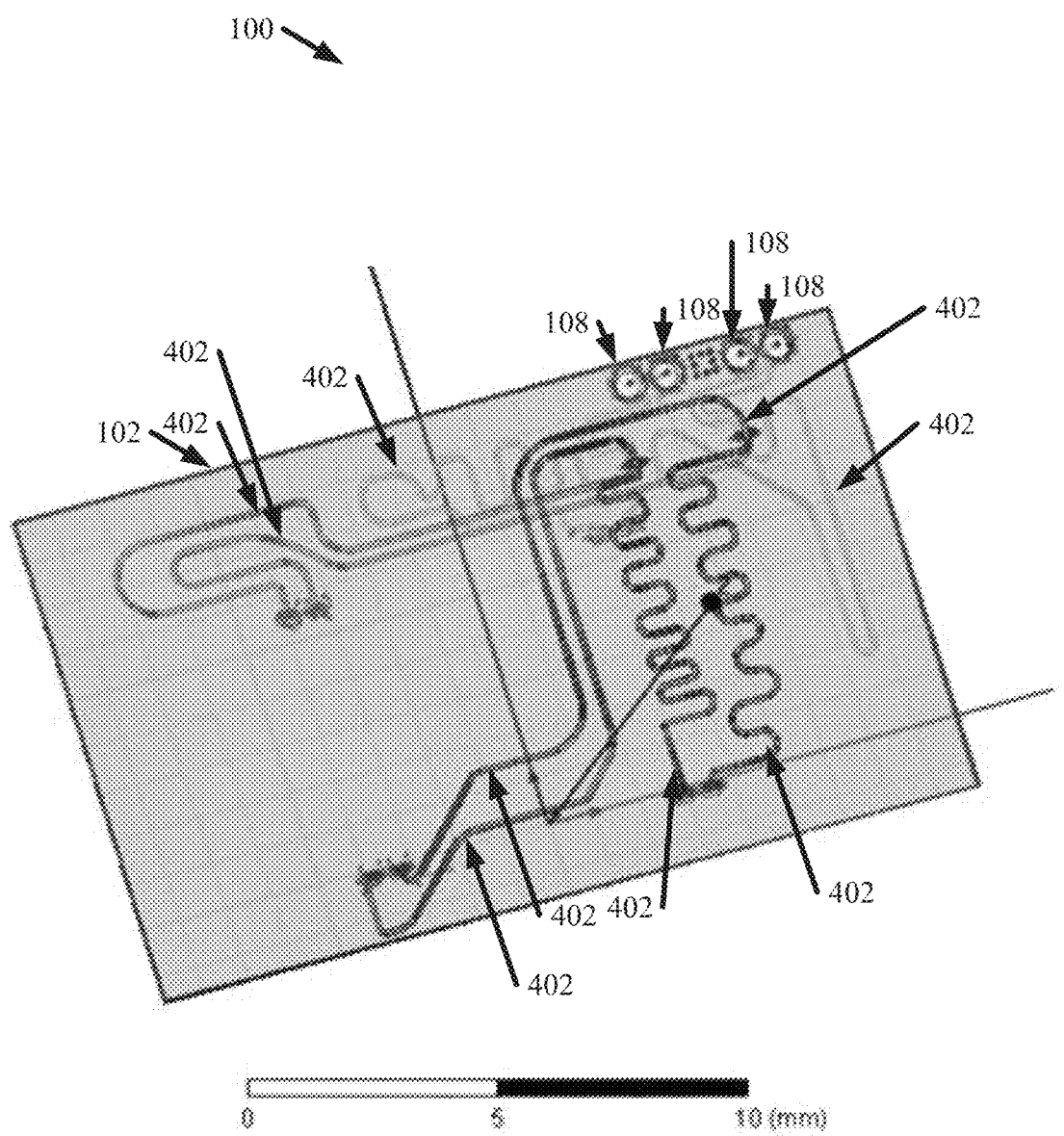
FIG. 14 illustrates a three-dimensional rendition of an example, non-limiting phased array in accordance with one or more embodiments described herein.

FIG. 14 illustrates a three-dimensional diagram of an example, non-limiting routing scheme 600 that can be implemented in the phased arrays 100 of FIG. 13. Repetitive description of like elements employed in other embodiments described herein is omitted for sake of brevity. For example, FIG. 14 shows paths within the antenna-in-package substrate 102 that can be traversed by the first set of transmission lines 402, the second set of transmission lines 402, the third set of transmission lines 402, the fourth set of transmission lines 402, and/or fifth transmission line 402 (e.g., a transmission line 402 that carries the combined signal) described herein with regard to FIG. 13. As shown in FIG. 14, the plurality of transmission lines 402 can traverse the antenna-in-package substrate 102 in various patterns in order to achieve proper lengths to facilitate the impedance matching described herein.

One or more embodiments of the structure shown in FIG. 14 can be implemented in a variety of phased array packages. For example, one or more embodiments of the structure shown in FIG. 14 can be implemented in the phased array 100 described herein (e.g., a scalable phased array 100 comprising a plurality of integrated circuits 202 on a super die 106) and/or in a conventional phased array package. For instance, the structure exemplified in FIG. 14 can be implemented in combination with an antenna-in-package substrate 102 and/or BGA terminals 108 as described in one or more embodiments herein.

Figure 15:
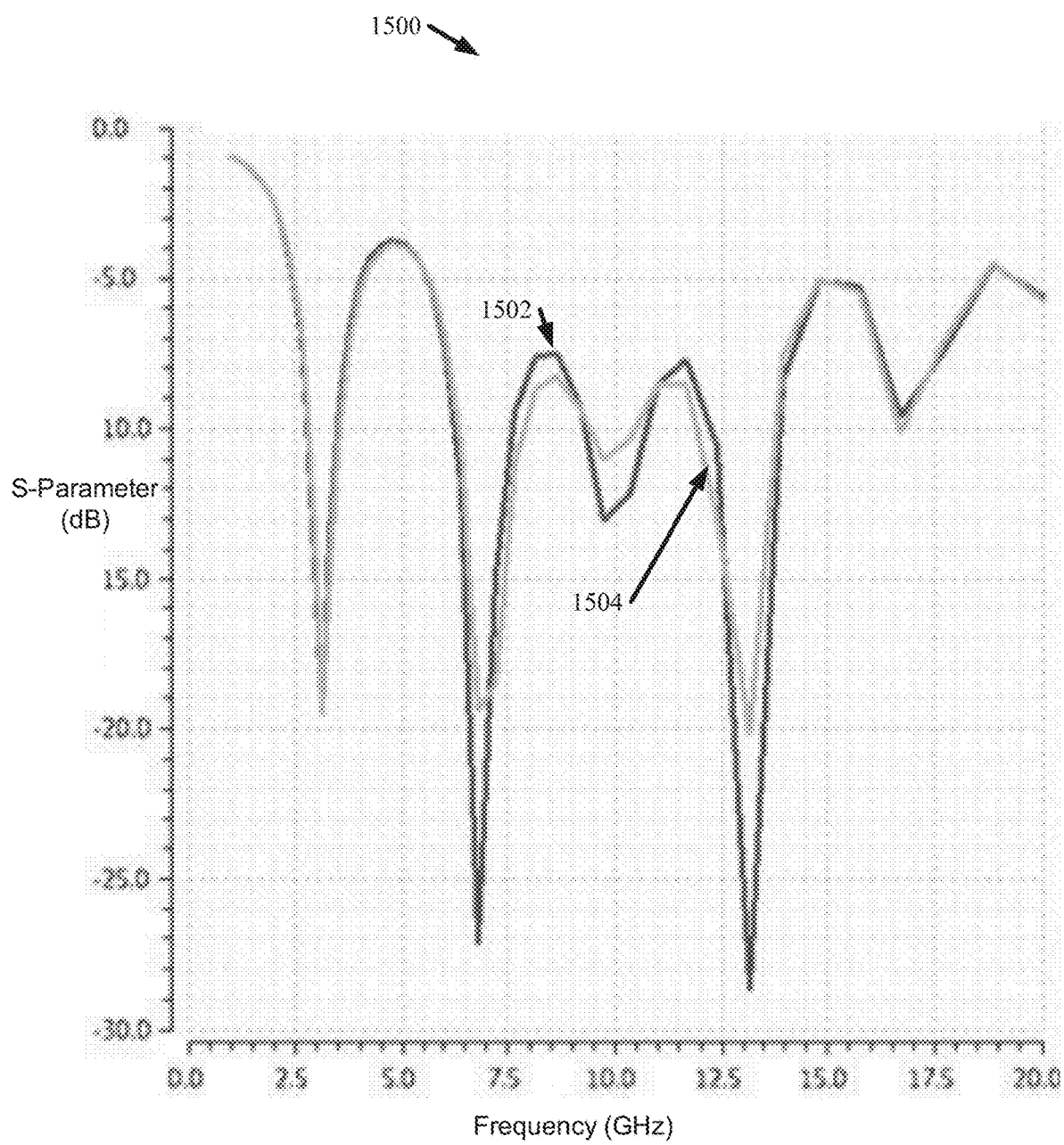
FIG. 15 illustrates a chart of an example, non-limiting graph regarding trace widths of a transmission line comprising a phased array in accordance with one or more embodiments described herein.

FIG. 15 illustrates a diagram of an example, non-limiting graph 1500 that can depict the effect of varying trace widths of one or more of the transmission lines 402 in accordance with one or more embodiments described herein. Repetitive description of like elements employed in other embodiments described herein is omitted for sake of brevity. Graph 1500 can regard the trace width of one or more transmission lines 402 that extend from a combining point 602 and/or combiner output 604 to a BGA terminal 108. Line 1502 can represent a transmission line 402 with a trace width of 90 micrometers (μm). Line 1504 can represent a transmission line 402 with a trace width of 80 μm.

Figure 16:
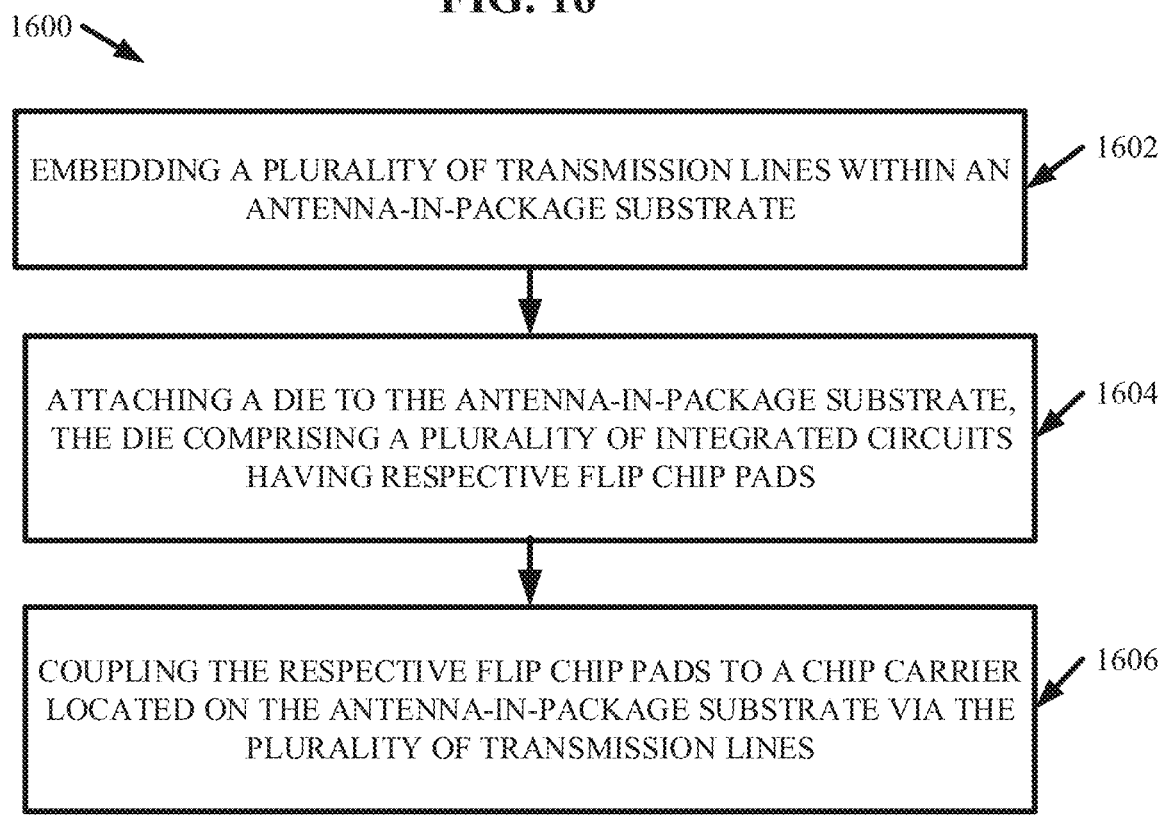
FIG. 16 illustrates a flow chart of an example, non-limiting method of manufacturing a phased array in accordance with one or more embodiments described herein.

FIG. 16 illustrates a flow diagram of an example, non-limiting method 1600 that can facilitate manufacturing of a phased array 100 in accordance with one or more embodiments described herein. Repetitive description of like elements employed in other embodiments described herein is omitted for sake of brevity.

At 1602, the method 1600 can comprise embedding a plurality of transmission lines 402 within an antenna-in-package substrate 102. As described in various embodiments herein, the plurality of transmission lines 402 can traverse a single layer of the antenna-in-package substrate 102 and/or multiple layers of the antenna-in-package substrate 102.

At 1604, the method 1600 can comprise attaching a die (e.g., a super die such as super die 106) to the antenna-in-package substrate 102. The die (e.g., a super die such as super die 106) can comprise a plurality of integrated circuits 202 having respective flip chip pads 502. The attaching at 1604 can comprise a flip chip process in which respective flip chip pads (e.g., flip chip pads 502) on the plurality of integrated circuits 202 can align with flip chip bump pads 107 on the antenna-in-package substrate 102. Additionally, a reflow process can facilitate attachment of the die (e.g., a super die such as super die 106) to the antenna-in-package substrate 102 at 1604. Since the die (e.g., a super die such as super die 106) can comprise a plurality of integrated circuits 202 the attaching at 1604 can comprise a single reflow process; as opposed to multiple reflow processes that would be necessitated by the attachment of multiple dies comprising respective integrated circuits 202. Moreover, the attaching at 1604 can comprise an underfill process with an electrically-insulating adhesive. The underfill process can further facilitate attachment of the die (e.g., a super die such as super die 106) to the antenna-in-package substrate 102 while also provided mechanical strength to the phased array 100. Also, since the die (e.g., super die 106) can comprise a plurality of integrated circuits 202 the attaching at 1604 can comprise a single underfill process; as opposed to multiple underfill processes that would be necessitated by the attachment of multiple dies comprising respective integrated circuits 202.

At 1606, the method 1600 can comprise coupling the respective flip chip pads 502 to one or more BGA terminals 108 located on the antenna-in-package substrate 102 via the plurality of transmission lines 402. The plurality of transmission lines 402 can be embedded within the antenna-in-package substrate 102 and operatively connect the flip chip pads 502 to the one or more BGA terminals 108 (e.g., one or more BGA pads).

In one or more embodiments, the method 1600 can further comprise attaching a second die (e.g., a super die such as super die 106) to the antenna-in-package substrate 102, wherein the second die (e.g., a super die such as super die 106) can comprise a second plurality of integrated circuits 202 having respective second flip chip pads 502. Also, the method 1600 can comprise coupling the respective second flip chip pads 502 to the one or more BGA terminals 108 located on the antenna-in-package substrate 102 via the plurality of transmission lines 402.

Figure 17:
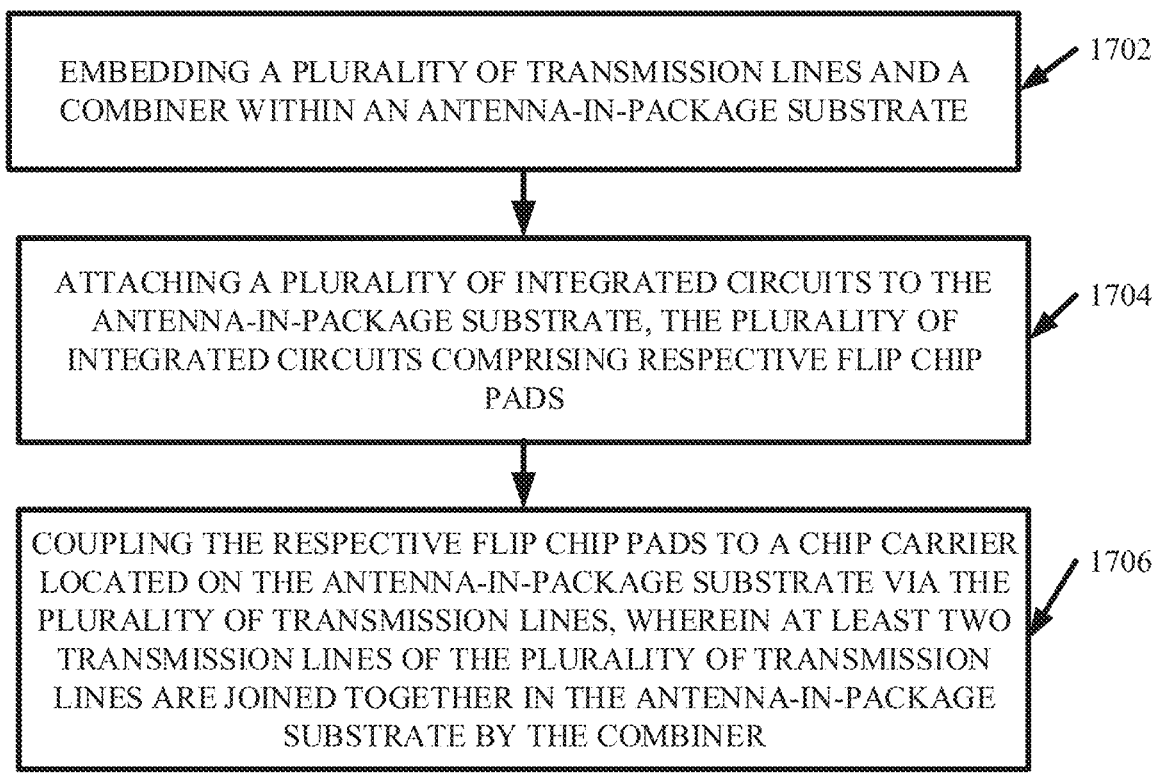
FIG. 17 illustrates another flow chart of an example, non-limiting method of manufacturing a phased array in accordance with one or more embodiments described herein.

FIG. 17 illustrates a flow diagram of an example, non-limiting method 1700 that can facilitate manufacturing of a phased array 100 in accordance with one or more embodiments described herein. Repetitive description of like elements employed in other embodiments described herein is omitted for sake of brevity.

At 1702, the method 1700 can comprise embedding a plurality of transmission lines 402 and/or one or more combiners (e.g., combining point 602 and/or combiner output 604) within an antenna-in-package substrate 102. As described in various embodiments herein, the plurality of transmission lines 402 and/or the one or more combiners (e.g., combining point 602 and/or combiner output 604) can traverse a single layer of the antenna-in-package substrate 102 and/or multiple layers of the antenna-in-package substrate 102.

At 1704, the method 1700 can comprise attaching a plurality of integrated circuits 202 to the antenna-in-package substrate 102, the plurality of integrated circuits 202 comprising respective flip chip pads. The attaching at 1704 can comprise a flip chip process in which respective flip chip pads 502 on the plurality of integrated circuits 202 can align with flip chip bump pads 107 on the antenna-in-package substrate 102. Additionally, a reflow process can facilitate attachment of the plurality of integrated circuits 106 to the antenna-in-package substrate 102 at 1704. In one or more embodiments, the plurality of integrated circuits 106 can be a part of a super die, wherein the attaching at 1704 can comprise a single reflow process; as opposed to multiple reflow processes that would be necessitated by the attachment of multiple dies comprising respective integrated circuits 202. Moreover, the attaching at 1704 can comprise an underfill process with an electrically-insulating adhesive. The underfill process can further facilitate attachment of the die (e.g., a super die such as super die 106) to the antenna-in-package substrate 102 while also provided mechanical strength to the phased array 100. In one or more embodiments, the plurality of integrated circuits 202 can be a part of a super die (e.g., a super die such as super die 106), wherein the attaching at 1704 can comprise a single underfill process; as opposed to multiple underfill processes that would be necessitated by the attachment of multiple dies comprising respective integrated circuits 202.

At 1706, the method 1700 can comprise coupling the respective flip chip pads 502 to one or more BGA terminals 108 located on the antenna-in-package substrate 102 via the plurality of transmission lines 402. At least two transmission lines 402 of the plurality of transmission lines 402 can be joined together in the antenna-in-package substrate 102 by the combiner (e.g., one or more combining points 602 and/or combiner outputs 604). For example, the coupling at 1706 can be facilitated by one or more embodiments of routing scheme 600 (e.g., as shown in FIGS. 6 and 7).

Figure 18:
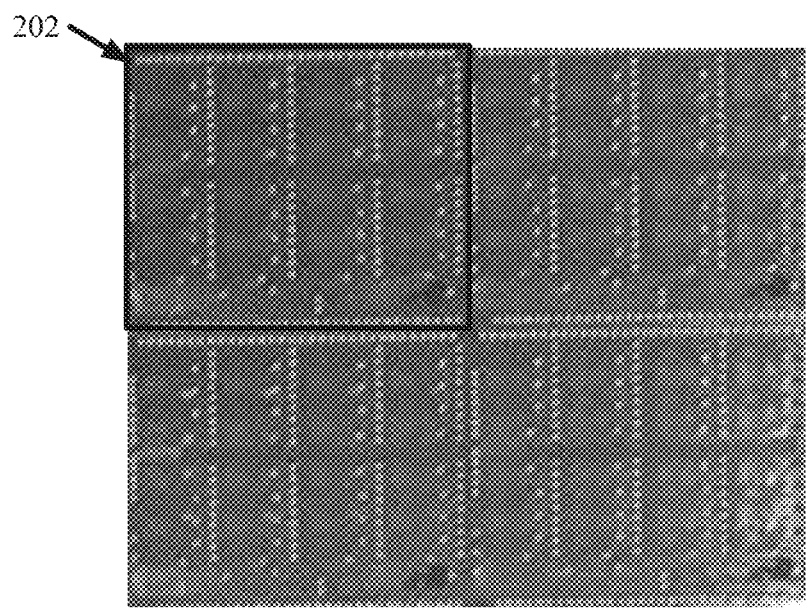
FIG. 18 illustrates a photo of an example, non-limiting die that can be included in on or more phased arrays in accordance with one or more embodiments described herein.
Figure 19:
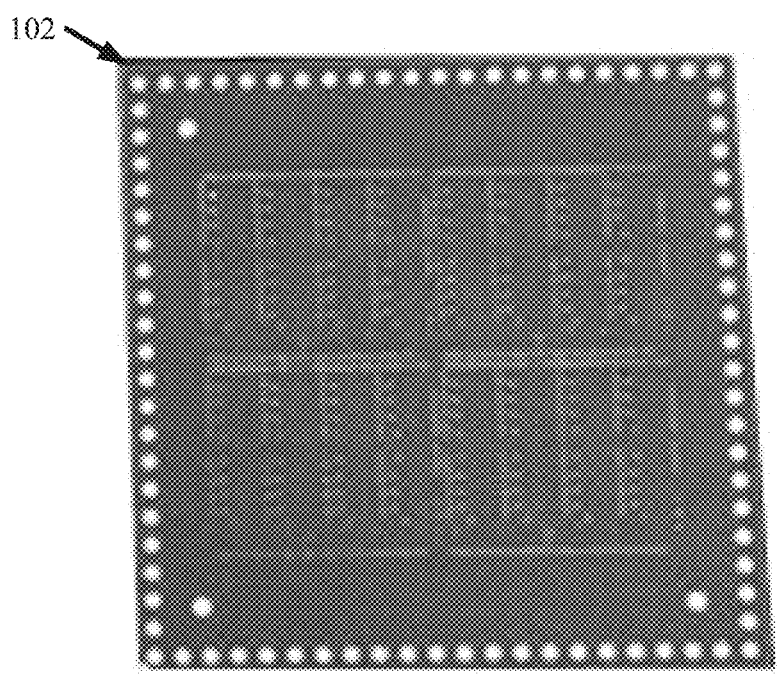
FIG. 19 illustrates a photo of an example, non-limiting bare package that can be included in on or more phased arrays in accordance with one or more embodiments described herein.
Figure 20:
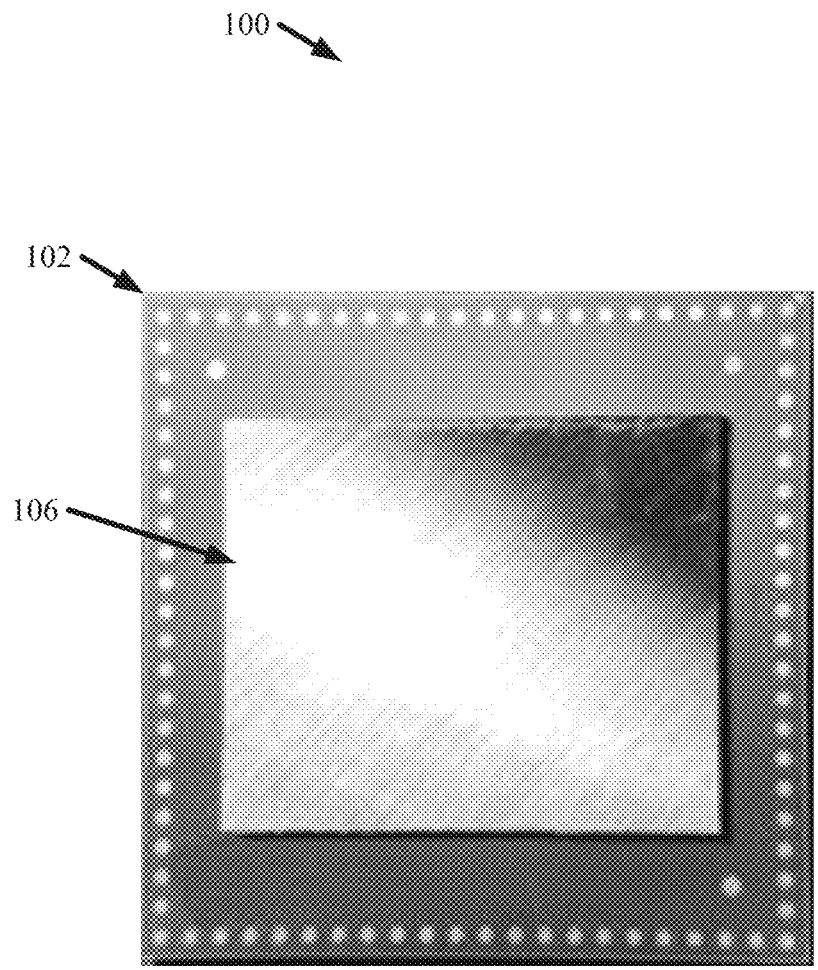
FIG. 20 illustrates a photo of an example, non-limiting flip chip attachment after one reflow that can be included in on or more phased arrays in accordance with one or more embodiments described herein.
Figure 21:
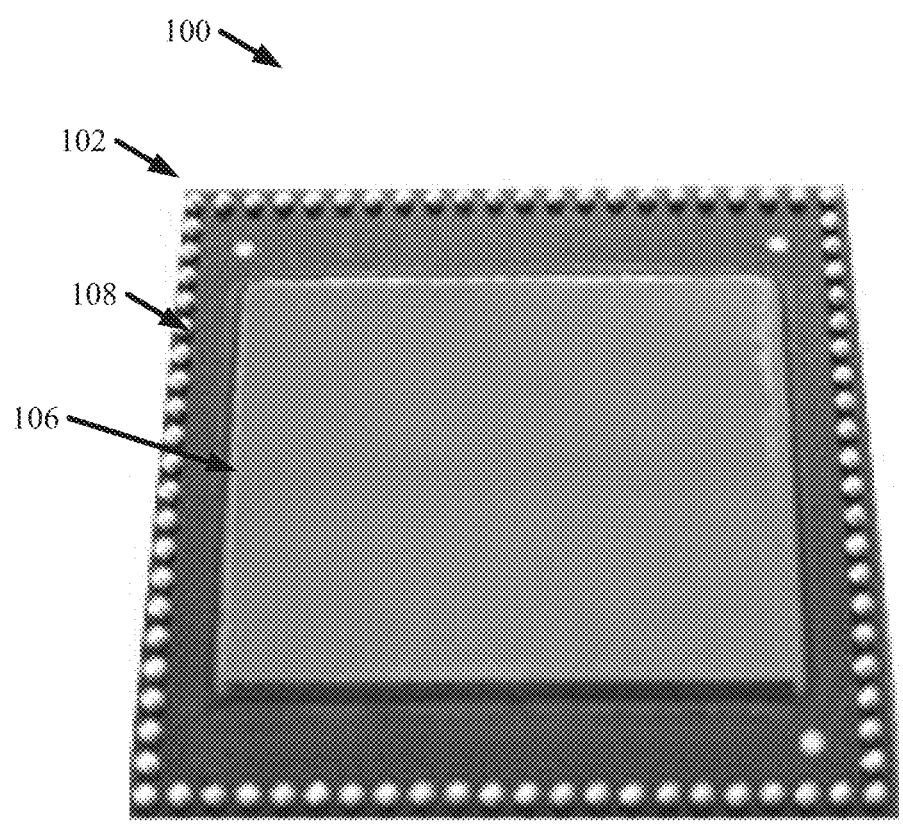
FIG. 21 illustrates a photo of an example, non-limiting chip carrier attachment and underfill that can be included in on or more phased arrays in accordance with one or more embodiments described herein.

FIGS. 18-21 illustrate photos of example, non-limiting phased arrays 100 at various points of the method 1600 and the method 1700 in accordance with one or more embodiments described herein. Repetitive description of like elements employed in other embodiments described herein is omitted for sake of brevity. FIG. 18 shows a super die 106, which can comprise a plurality of integrated circuits 202 (e.g., four integrated circuits 202), prior to attachment to an antenna-in-package substrate 102 at 1604 of method 1600 and/or 1704 of method 1700. FIG. 19 shows an antenna-in-package substrate 102, which can comprise a layout of pads (e.g., flip chip bump pads 107) and/or wiring (e.g., embedded transmission lines 402) designed to accommodate a plurality of integrated circuits 202 (e.g., a super die 106 as if it were a single-chip module), prior to attachment to the plurality of integrated circuits 202 at 1604 of method 1600 and/or 1704 of method 1700. FIG. 20 shows a phased array 100 after the plurality of integrated circuits 202 (e.g., comprising a super die 106) can be attached (e.g., via a flip chip process and/or a reflow process) to the antenna-in-package substrate 102 at 1604 of method 1600 and/or 1704 of method 1700. FIG. 21 shows a phased array 100 with one or more BGA terminals 108 after the plurality of integrated circuits 202 (e.g., comprising a super die 106) can be attached (e.g., via an underfill process) to the antenna-in-package substrate 102 at 1604 of method 1600 and/or 1704 of method 1700.

Figure 22:
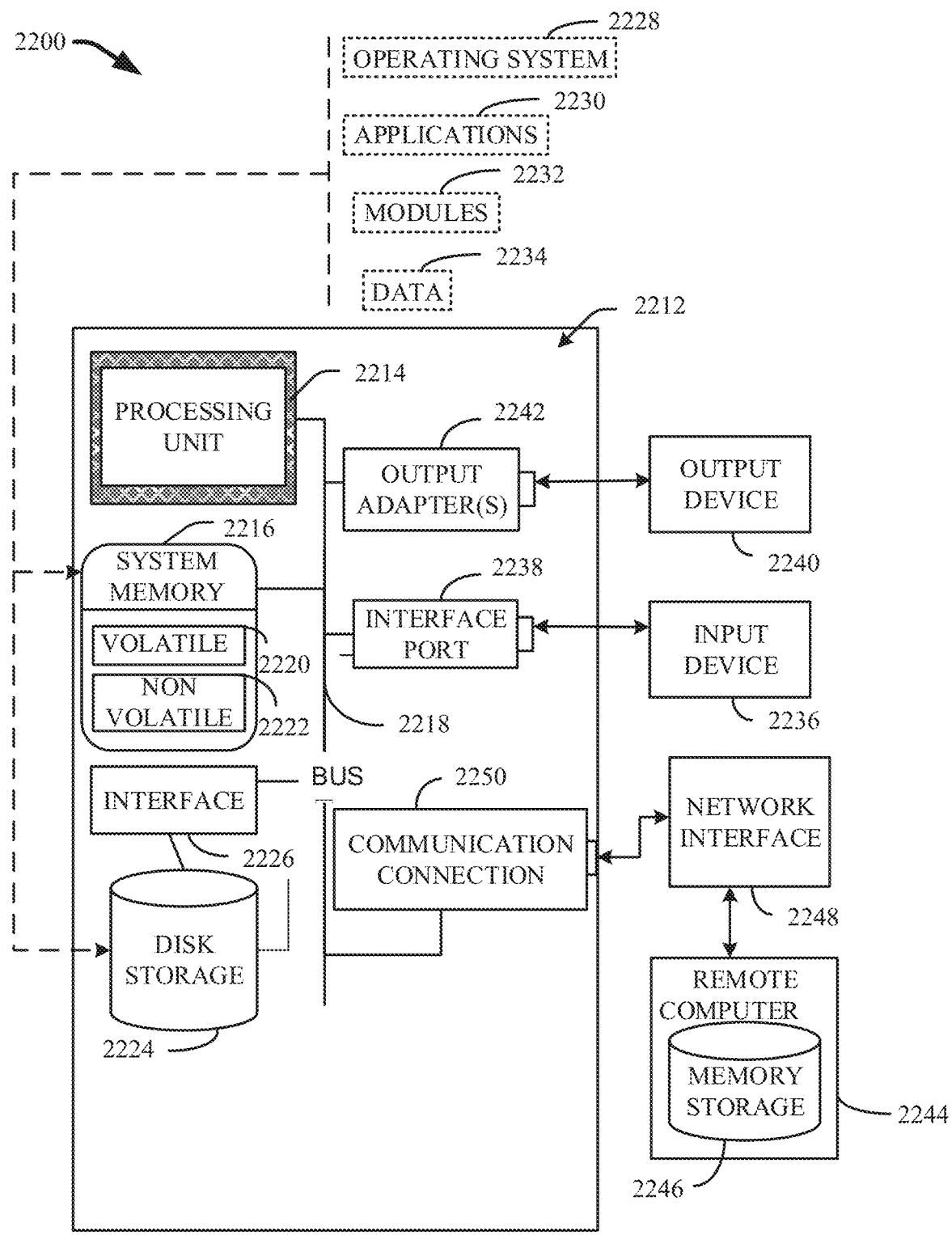
FIG. 22 illustrates a block diagram of an example, non-limiting operating environment in which one or more embodiments described herein can be facilitated

In order to provide a context for the various aspects of the disclosed subject matter, FIG. 22 as well as the following discussion are intended to provide a general description of a suitable environment in which the various aspects of the disclosed subject matter can be implemented. FIG. 22 illustrates a block diagram of an example, non-limiting operating environment in which one or more embodiments described herein can be facilitated. Repetitive description of like elements employed in other embodiments described herein is omitted for sake of brevity. With reference to FIG. 22, a suitable operating environment 2200 for implementing various aspects of this disclosure can include a computer 2212. The computer 2212 can also include a processing unit 2214, a system memory 2216, and a system bus 2218. The system bus 2218 can operably couple system components including, but not limited to, the system memory 2216 to the processing unit 2214. The processing unit 2214 can be any of various available processors. Dual microprocessors and other multiprocessor architectures also can be employed as the processing unit 2214. The system bus 2218 can be any of several types of bus structures including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire, and Small Computer Systems Interface (SCSI). The system memory 2216 can also include volatile memory 2220 and nonvolatile memory 2222. The basic input/output system (BIOS), containing the basic routines to transfer information between elements within the computer 2212, such as during start-up, can be stored in nonvolatile memory 2222. By way of illustration, and not limitation, nonvolatile memory 2222 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 2220 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 2212 can also include removable/non-removable, volatile/non-volatile computer storage media. FIG. 22 illustrates, for example, a disk storage 2224. Disk storage 2224 can also include, but is not limited to, devices like a magnetic disk drive, floppy disk drive, tape drive, Jaz drive, Zip drive, LS-100 drive, flash memory card, or memory stick. The disk storage 2224 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 2224 to the system bus 2218, a removable or non-removable interface can be used, such as interface 2226. FIG. 22 also depicts software that can act as an intermediary between users and the basic computer resources described in the suitable operating environment 2200. Such software can also include, for example, an operating system 2228. Operating system 2228, which can be stored on disk storage 2224, acts to control and allocate resources of the computer 2212. System applications 2230 can take advantage of the management of resources by operating system 2228 through program modules 2232 and program data 2234, e.g., stored either in system memory 2216 or on disk storage 2224. It is to be appreciated that this disclosure can be implemented with various operating systems or combinations of operating systems. A user enters commands or information into the computer 2212 through one or more input devices 2236. Input devices 2236 can include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices can connect to the processing unit 2214 through the system bus 2218 via one or more interface ports 2238. The one or more Interface ports 2238 can include, for example, a serial port, a parallel port, a game port, and a universal serial bus (USB). One or more output devices 2240 can use some of the same type of ports as input device 2236. Thus, for example, a USB port can be used to provide input to computer 2212, and to output information from computer 2212 to an output device 2240. Output adapter 2242 can be provided to illustrate that there are some output devices 2240 like monitors, speakers, and printers, among other output devices 2240, which require special adapters. The output adapters 2242 can include, by way of illustration and not limitation, video and sound cards that provide a means of connection between the output device 2240 and the system bus 2218. It should be noted that other devices and/or systems of devices provide both input and output capabilities such as one or more remote computers 2244.

Computer 2212 can operate in a networked environment using logical connections to one or more remote computers, such as remote computer 2244. The remote computer 2244 can be a computer, a server, a router, a network PC, a workstation, a microprocessor based appliance, a peer device or other common network node and the like, and typically can also include many or all of the elements described relative to computer 2212. For purposes of brevity, only a memory storage device 2246 is illustrated with remote computer 2244. Remote computer 2244 can be logically connected to computer 2212 through a network interface 2248 and then physically connected via communication connection 2250. Further, operation can be distributed across multiple (local and remote) systems. Network interface 2248 can encompass wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). One or more communication connections 2250 refers to the hardware/software employed to connect the network interface 2248 to the system bus 2218. While communication connection 2250 is shown for illustrative clarity inside computer 2212, it can also be external to computer 2212. The hardware/software for connection to the network interface 2248 can also include, for exemplary purposes only, internal and external technologies such as, modems including regular telephone grade modems, cable modems and DSL modems, ISDN adapters, and Ethernet cards.

Embodiments of the present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device including, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components including a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a plurality of integrated circuits having respective flip chip pads;
   an antenna-in-package substrate attached to a ball grid array terminal that directly connects the antenna-in-package substrate and a printed circuit board, wherein the antenna-in-package substrate is also attached to one or more of the plurality of integrated circuits via one or more flip chip bump pads;
   a plurality of transmission lines embedded within the antenna-in-package substrate; and
   a combiner that receives one or more inputs from the plurality of transmission lines driven by one or more active signal amplifiers located on one or more of the plurality of integrated circuits and having respective load resistance that matches an impedance of inputs to the combiner in lieu of including a resistor in the combiner, wherein the plurality of transmission lines and the combiner are embedded within the antenna-in-package substrate, wherein the plurality of transmission lines are joined by the combiner, and wherein the combiner couples the respective flip chip pads to the ball grid array terminal.

2. The apparatus of claim 1, wherein the plurality of integrated circuits are radio frequency integrated circuits.

3. The apparatus of claim 1, wherein a first transmission line of the plurality of transmission lines extends from a first flip chip pad of the respective flip chip pads to the combiner, wherein a second transmission line of the plurality of transmission lines extends from a second flip chip pad of the respective flip chip pads to the combiner, and wherein a third transmission line of the plurality of transmission lines extends from the combiner to the ball grid array terminal.

4. The apparatus of claim 3, wherein the first transmission line and the second transmission line have a first impedance characteristic and the third transmission line has a second impedance characteristic, and wherein the second impedance characteristic is less than the first impedance characteristic.

5. The apparatus of claim 3, wherein the antenna-in-package substrate comprises a plurality of layers, wherein the first transmission line and the second transmission line traverse a first layer of the plurality of layers of the antenna-in-package substrate.

6. The apparatus of claim 3, wherein the antenna-in-package substrate comprises a plurality of layers, wherein the first transmission line traverses a first layer of the plurality of layers of the antenna-in-package substrate, and wherein the second transmission line traverses a second layer of the plurality of layers of the antenna-in-package substrate.

7. The apparatus of claim 3, wherein the plurality of integrated circuits are located on a common die.

8. The apparatus of claim 1, wherein a first transmission line of the plurality of transmission lines extends from a first flip chip pad of the respective flip chip pads to the combiner, wherein a second transmission line of the plurality of transmission lines extends from a second flip chip pad of the respective flip chip pads to the combiner, wherein a third transmission line of the plurality of transmission lines extends from the combiner to a second combiner, and wherein the second combiner is embedded in the antenna-in-package substrate and joins the third transmission line with a fourth transmission line of the plurality of transmission lines.

9. The apparatus of claim 1, wherein the plurality of integrated circuits comprises four integrated circuits.

10. An apparatus, comprising:
a plurality of integrated circuits having respective flip chip pads;
an antenna-in-package substrate connected to a ball grid array terminal that directly connects the antenna-in-package substrate and a printed circuit board, wherein the antenna-in-package substrate is also attached to one or more of the plurality of integrated circuits via one or more flip chip bump pads;
a plurality of transmission lines; and
a combiner having one or more inputs from the plurality of transmission lines wherein the one or more inputs are driven by the one or more active signal amplifiers located on one or more of the plurality of integrated circuits, and the combiner embedded within the antenna-in-package substrate, and the plurality of transmission lines operatively coupling the respective flip chip pads to the ball grid array terminal, wherein at least two transmission lines of the plurality of transmission lines are joined together via the combiner.

11. The apparatus of claim 10, wherein the plurality of integrated circuits are radio frequency integrated circuits.

12. The apparatus of claim 10, wherein a first transmission line of the plurality of transmission lines extends from a first flip chip pad of the respective flip chip pads to the combiner, wherein a second transmission line of the plurality of transmission lines extends from a second flip chip pad of the respective flip chip pads to the combiner, and wherein a third transmission line of the plurality of transmission lines extends from the combiner to the ball grid array terminal.

13. The apparatus of claim 12, wherein the first transmission line and the second transmission line have a first impedance characteristic and the third transmission line has a second impedance characteristic, and wherein the second impedance characteristic is less than the first impedance characteristic.

14. The apparatus of claim 10, wherein a first transmission line of the plurality of transmission lines extends from a first flip chip pad of the respective flip chip pads to the combiner, wherein a second transmission line of the plurality of transmission lines extends from a second flip chip pad of the respective flip chip pads to the combiner, wherein a third transmission line of the plurality of transmission lines extends from the combiner to a second combiner, and wherein the second combiner is embedded in the antenna-in-package substrate and joins the third transmission line with a fourth transmission line of the plurality of transmission lines.

* * * * *